US012690195B2

(12) United States Patent
Ha et al.

(10) Patent No.: US 12,690,195 B2
(45) Date of Patent: Jul. 21, 2026

(54) SEMICONDUCTOR DEVICE

(71) Applicant: SAMSUNG ELECTRONICS CO., LTD., Suwon-si (KR)

(72) Inventors: Daewon Ha, Suwon-si (KR); Kyunghwan Lee, Suwon-si (KR); Youngnam Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 607 days.

(21) Appl. No.: 18/102,349

(22) Filed: Jan. 27, 2023

(65) Prior Publication Data

US 2023/0380176 A1 Nov. 23, 2023

(30) Foreign Application Priority Data

May 17, 2022 (KR) ........................ 10-2022-0060056

(51) Int. Cl.
H10B 51/30 (2023.01)
H10B 51/40 (2023.01)

(52) U.S. Cl.
CPC ............. H10B 51/30 (2023.02); H10B 51/40 (2023.02)

(58) Field of Classification Search
CPC ........ H10B 51/30; H10B 51/40; H10B 51/50; G11C 11/223; G11C 11/54; G11C 11/2255; G11C 11/2257
See application file for complete search history.

(56) References Cited

U.S. PATENT DOCUMENTS

| | | | | |
|---|---|---|---|---|
| 6,072,711 | A * | 6/2000 | Kang | ..................... H10B 53/00 365/65 |
| 6,532,165 | B1 * | 3/2003 | Katori | ................ H10D 30/0415 257/E21.663 |
| 6,566,698 | B2 * | 5/2003 | Nishihara | .............. H10B 53/00 257/295 |
| 10,686,040 | B2 | 6/2020 | Frank et al. | |
| 10,734,447 | B2 | 8/2020 | Ando et al. | |
| 10,885,963 | B2 | 1/2021 | Nikonov et al. | |
| 11,211,429 | B2 | 12/2021 | Tang et al. | |
| 11,961,910 | B2 * | 4/2024 | Pešić | .................... H10D 30/701 |
| 12,277,961 | B2 * | 4/2025 | Hwang | ............... G11C 11/2273 |

(Continued)

OTHER PUBLICATIONS

Jerry, "Ferroelectric FET Analog Synapse for Acceleration of Deep Neural Network Training," IEDM, 2017, (4 total pages).

(Continued)

*Primary Examiner* — Bitew A Dinke
(74) *Attorney, Agent, or Firm* — Sughrue Mion, PLLC

(57) ABSTRACT

A semiconductor device includes a cell region including a plurality of memory cells, and a peripheral circuit region controlling the plurality of memory cells. Each of the plurality of memory cells includes a first active region and a second active region adjacent to each other, a first channel layer and a second channel layer extending in the first direction, connected to the first active region and the second active region, and separated from each other in the third direction, a first ferroelectric layer and a first gate electrode layer sequentially provided on the first channel layer, and a second ferroelectric layer and a second gate electrode layer sequentially provided on the second channel layer. The first gate electrode layer and the second gate electrode layer are separated from each other in the third direction.

20 Claims, 42 Drawing Sheets

(56)     References Cited

U.S. PATENT DOCUMENTS

| | | | | |
|---|---|---|---|---|
| 2009/0231942 | A1* | 9/2009 | Lee | H10D 86/01 |
| | | | | 365/230.01 |
| 2011/0299318 | A1* | 12/2011 | Kaneko | H10D 30/701 |
| | | | | 257/295 |
| 2014/0269063 | A1* | 9/2014 | Nagatsuka | G11C 16/08 |
| | | | | 365/185.05 |
| 2014/0269099 | A1* | 9/2014 | Nagatsuka | H10B 41/70 |
| | | | | 365/185.23 |
| 2015/0311142 | A1* | 10/2015 | Sekar | H10D 84/85 |
| | | | | 257/499 |
| 2017/0162702 | A1* | 6/2017 | Hu | H10D 64/689 |
| 2018/0012123 | A1 | 1/2018 | Han et al. | |
| 2018/0349762 | A1* | 12/2018 | Lee | H10D 64/689 |
| 2019/0148406 | A1* | 5/2019 | Liu | H10D 64/033 |
| | | | | 257/295 |
| 2019/0172826 | A1* | 6/2019 | Or-Bach | H01L 23/5226 |
| 2019/0333967 | A1* | 10/2019 | Park | H10B 63/34 |
| 2020/0027897 | A1* | 1/2020 | Zhu | H10D 30/0413 |
| 2020/0035691 | A1* | 1/2020 | Reznicek | H10D 64/017 |
| 2020/0075574 | A1* | 3/2020 | Smith | H10D 30/43 |
| 2020/0185528 | A1* | 6/2020 | Yamazaki | H10D 30/6739 |
| 2020/0294995 | A1* | 9/2020 | Kim | H10D 64/254 |
| 2020/0303208 | A1* | 9/2020 | Xu | H10D 30/43 |
| 2020/0303388 | A1* | 9/2020 | Reznicek | H10D 30/689 |
| 2021/0056401 | A1 | 2/2021 | Obradovic et al. | |
| 2021/0335802 | A1* | 10/2021 | Lee | H01L 21/76877 |
| 2021/0343544 | A1 | 11/2021 | Xu et al. | |
| 2021/0359122 | A1 | 11/2021 | Or-Bach | |
| 2021/0391462 | A1 | 12/2021 | Choi et al. | |
| 2021/0399013 | A1* | 12/2021 | Wu | H01L 23/5226 |
| 2021/0408043 | A1 | 12/2021 | Yeong et al. | |
| 2022/0215870 | A1* | 7/2022 | Jung | G11C 11/2259 |
| 2022/0223741 | A1* | 7/2022 | Chang | H10D 64/689 |
| 2022/0278129 | A1* | 9/2022 | Lu | H10D 30/6211 |
| 2022/0383953 | A1* | 12/2022 | Kamisaka | H10D 30/6757 |
| 2022/0399351 | A1* | 12/2022 | Yu | H10D 64/689 |
| 2023/0078381 | A1* | 3/2023 | Liebmann | H10D 84/0128 |
| | | | | 257/401 |
| 2023/0178554 | A1* | 6/2023 | Chehab | H10D 84/0186 |
| | | | | 257/351 |
| 2023/0343823 | A1* | 10/2023 | Baek | H10D 30/43 |
| 2023/0363153 | A1* | 11/2023 | Zhu | H10B 43/27 |
| 2025/0048690 | A1* | 2/2025 | Chehab | H10D 88/01 |

OTHER PUBLICATIONS

Communication issued Nov. 16, 2023 by the Korean Patent Office in Korean Application No. 10-2022-0060056.

* cited by examiner $$\sigma \left( b + \sum_{i=1}^{N} a_i w_i \right)$$

SEMICONDUCTOR DEVICE

CROSS-REFERENCE TO RELATED APPLICATION(S)

This application is based on and claims priority under 35 USC 119(a) from Korean Patent Application No. 10-2022-0060056 filed on May 17, 2022 in the Korean Intellectual Property Office, the entire disclosure of which is incorporated herein by reference for all purposes.

BACKGROUND

1. Field

The disclosure relates to a semiconductor device.

2. Description of Related Art

Ferroelectrics are materials having ferroelectricity maintaining polarization according to the alignment direction of electric dipoles therein. Recently, research is being carried out to apply such ferroelectricity to semiconductor devices for various uses.

SUMMARY

Example embodiments provide a semiconductor device, including a plurality of memory cells capable of writing data by adjusting an alignment direction of electric dipoles formed in a ferroelectric layer and suitable for performing computation based on a neural network.

According to an aspect of the disclosure, there is provided a semiconductor device including: a cell region comprising a plurality of memory cells arranged in a first direction and a second direction, the plurality of memory cells arranged parallel to an upper surface of a substrate; and a peripheral circuit region configured to control the plurality of memory cells, wherein each of the plurality of memory cells includes: a first active region and a second active region provided adjacent to each other in the first direction, the first active region and the second active region extending in a third direction, perpendicular to the upper surface of the substrate, a first channel layer and a second channel layer separated from each other in the third direction and connected to the first active region and the second active region, the first channel layer and the second channel layer extending in the first direction, a first ferroelectric layer and a first gate electrode layer sequentially provided on the first channel layer, and a second ferroelectric layer and a second gate electrode layer sequentially provided on the second channel layer, and wherein the first gate electrode layer and the second gate electrode layer are separated from each other in the third direction.

According to another aspect of the disclosure, there is provided a semiconductor device including: a cell region comprising a plurality of memory cells configured to store weight data corresponding to a weight of a neural network, each of the plurality of memory cells including: a first active region and a second active region provided adjacent to each other in a first direction, parallel to an upper surface of a substrate, a plurality of gate electrode layers extending in a second direction between the first active region and the second active region and separated from each other in a third direction, perpendicular to the upper surface of the substrate, and a plurality of channel layers surrounded by the plurality of gate electrode layers and connected to the first active region and the second active region in the first direction; an analog to digital converter (ADC) circuit connected to the first active region of each of the plurality of memory cells through a plurality of source lines and connected to the second active region of each of the plurality of memory cells through a plurality of bit lines; and a row driver connected to the plurality of gate electrode layers.

According to another aspect of the disclosure, there is provided a semiconductor device including: a cell region including: a plurality of memory cells, each of the plurality of memory cells comprising: two or more memory elements configured to share active regions, each of the two or more memory elements comprising a gate electrode layer and a channel layer, the plurality of memory cells being arranged in a first direction and a second direction parallel to an upper surface of a substrate, a plurality of source lines extending in the first direction, and a plurality of bit lines extending in the first direction and alternately provided with the plurality of source lines in the second direction; and a peripheral circuit region configured to control the plurality of memory cells, wherein the peripheral circuit region configured to distribute and store bits of weight data corresponding to a weight among weights included in a neural network in two or more memory cells commonly connected to one source line among the plurality of source lines and one bit line among the plurality of bit lines.

According to another aspect of the disclosure, there is provided a semiconductor device including: a plurality of memory cells provided in a first direction and a second direction on a substrate, each of the plurality of memory cells including: a first active region extending in a third direction perpendicular to an upper surface of the substrate, a second active region extending in the third direction, a first channel layer connected to the first active region and the second active region, a second channel layer connected to the first active region and the second active region, an insulating layer provided between the first channel layer and the second channel layer, a first ferroelectric layer and a first gate electrode layer provided on the first channel layer, and a second ferroelectric layer and a second gate electrode layer sequentially provided on the second channel layer.

BRIEF DESCRIPTION OF DRAWINGS

The above and other aspects, features, and advantages of the present inventive concept will be more clearly understood from the following detailed description, taken in conjunction with the accompanying drawings, in which:

FIGS. 1A and 1B are diagrams illustrating a neural network implemented in a semiconductor device according to an example embodiment;

DETAILED DESCRIPTION

Hereinafter, example embodiments will be described with reference to the accompanying drawings.

Figure 1A:
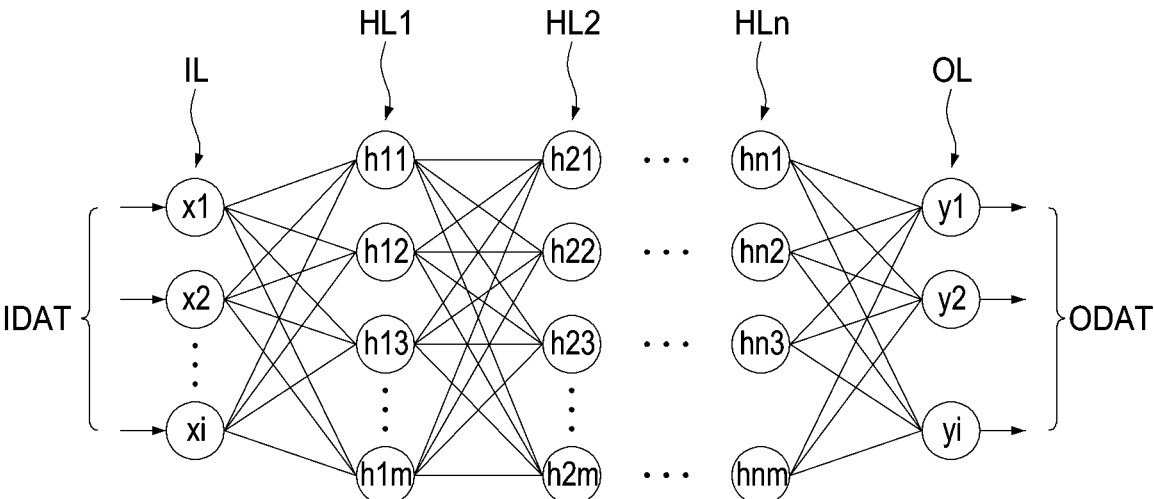
Figure 1B:
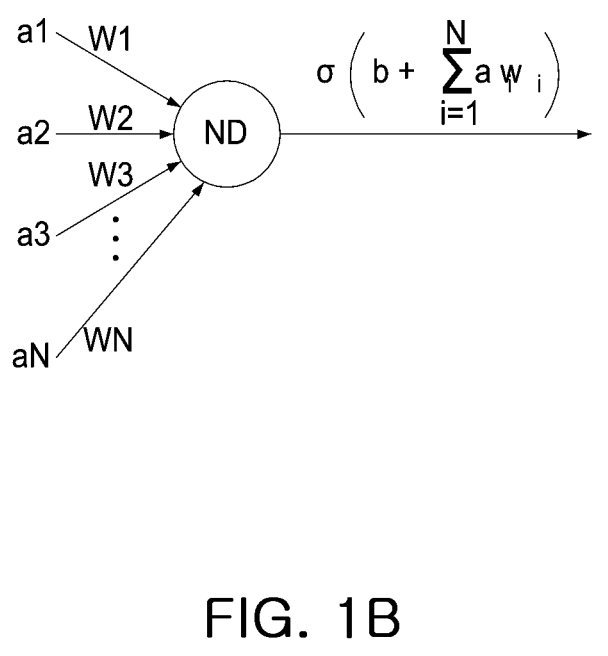

FIGS. 1A and 1B are diagrams illustrating a neural network implemented in a semiconductor device according to an example embodiment.

Referring to FIG. 1A, the network structure of a general neural network may include an input layer (IL), a plurality of hidden layers (HL1-HLn), and an output layer (OL). The input layer IL may include a plurality of input nodes (x1-$xi$), and vector input data IDAT of length i may be input to each input node (where i is a natural number).

The input data IDAT may be input to a hidden layer including a plurality of hidden layers HL1-HLn (where n is a natural number), and each of the hidden layers HL1-HLn may include hidden nodes. As an example, the first hidden layer HL1 may include a plurality of hidden nodes h11-h1$m$ (where m is a natural number), and the n-th hidden layer HLn may include m hidden nodes hn1-hnm.

In the example embodiment illustrated in FIG. 1A, it is illustrated that each of the hidden layers HL1-HLn includes the same number of hidden nodes, but the disclosure is not necessarily limited thereto. For example, at least some of the hidden layers HL1-HLn may include different numbers of hidden nodes.

The output layer OL may include a plurality of output nodes y1-$yj$ corresponding to the class to be classified (where j is a natural number). For example, the output layer OL may output a result for each class with respect to the input data IDAT as the output data ODAT. According to an example embodiment, the result may be a score or a class score.

The neural network illustrated in FIG. 1A may include a branch between nodes illustrated as a straight line between two nodes, and a weight used in each connection. At this time, nodes included in one layer may not be connected to each other, and nodes included in different layers may be fully or partially connected.

Each node in the neural network structure in FIG. 1A may receive the output of the previous node as an input, and may perform an operation, and may output the operation result to a subsequent node. At this time, each node may calculate the value to be output by applying the input value to a specific function, for example, a nonlinear function.

In general, the structure of a neural network is predetermined, and weights according to connections between nodes may be determined as appropriate values using a data set whose correct answer is already known. A data set with known correct answers used to determine weights is called training data, and the process of determining weights using training data may be referred to as learning.

FIG. 1B may be a diagram illustrating an example embodiment of an operation performed in one node ND among nodes included in the neural network of FIG. 1A. Referring to FIG. 1B, when a plurality of inputs a1-aN are provided to one node ND, the node ND may multiply each of then inputs a1-aN and N weights w1-wN corresponding to the inputs and add the same, and an offset (b) may be added to the summed value. Also, the node ND may generate one output value z by applying the offset-reflected value to a specific function 6.

When one of the layers included in the neural network according to the example embodiment illustrated in FIG. 1A includes M nodes ND illustrated in FIG. 1B, the output values of the one layer may be obtained as in [Equation 1] below.

$$Z=W*A \hspace{3cm} \text{[Equation 1]}$$

In Equation 1 above, W may represent a weight corresponding to all connections included in the one layer, and may be expressed in the form of an M×N matrix. A may represent n inputs (a1-aN) received by the one layer, and may be implemented in the form of an N×1 matrix. Z may represent m outputs (Z1-ZM) output from the one layer, and may be expressed in the form of an M×1 matrix.

Figure 2A:
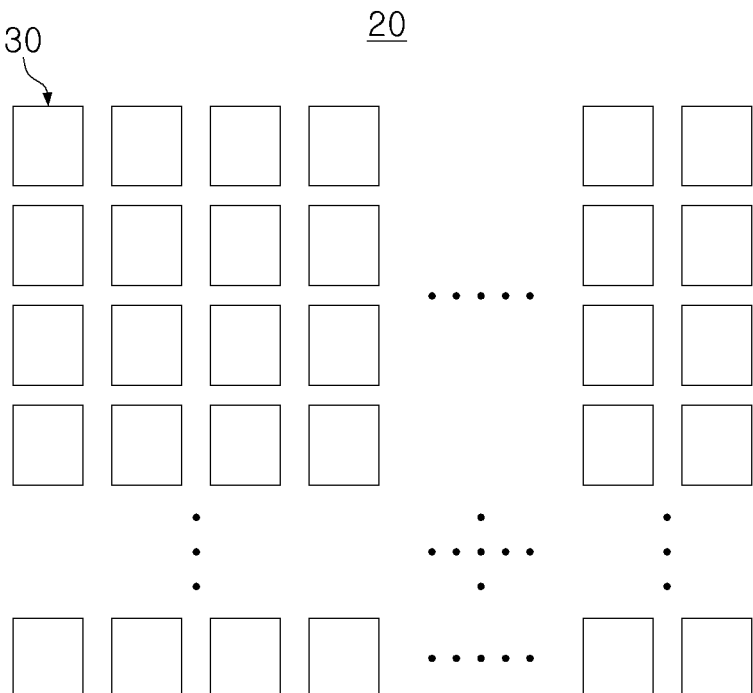
FIGS. 2A and 2B are diagrams illustrating a semiconductor device according to an example embodiment.
Figure 2B:
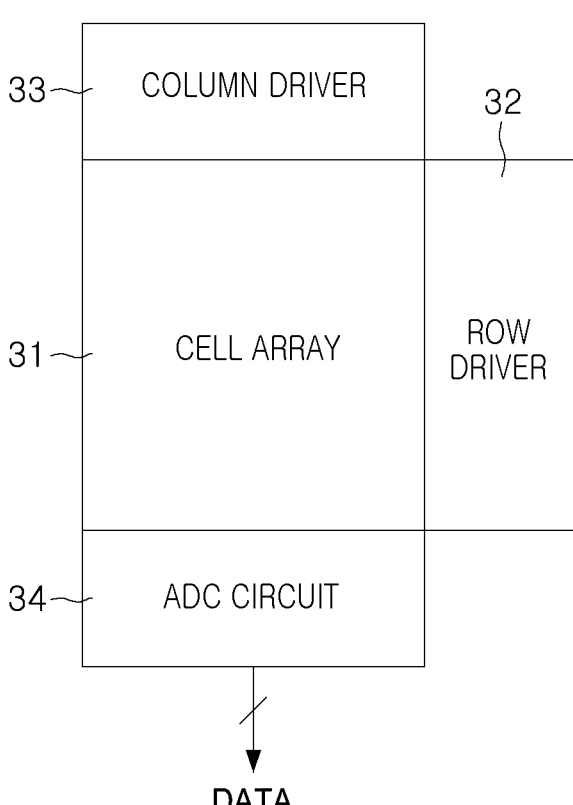

FIGS. 2A and 2B are diagrams illustrating a semiconductor device according to an example embodiment.

Referring to FIG. 2A, a semiconductor device 20 according to an example embodiment may include a plurality of tiles 30. Each of the plurality of tiles 30 may include a cell region in which a plurality of memory cells are provided, a peripheral circuit region in which peripheral circuits that control a plurality of memory cells to execute an operation based on a neural network are provided, and the like. Weights assigned to connection paths between a plurality of layers of a neural network may be stored in a plurality of memory cells in each of the plurality of tiles 30. For example, the weights may be quantized and stored in a plurality of memory cells.

In an example embodiment, weights included in one layer among a plurality of layers included in the neural network may be distributed and stored in two or more tiles 30. Two or more tiles 30 that divide and store weights included in one layer may be provided adjacent to each other in the neuromorphic device 20.

In each cell region of the plurality of tiles 30, a plurality of memory cells may be arranged in an array form to form a cell array. On the other hand, the peripheral circuit region of each of the plurality of tiles 30 may include a row driver, a column driver, and an analog-to-digital converter (ADC) circuit connected to the cell array.

For example, the row driver may be connected to a plurality of memory cells through word lines, and the column driver may be connected to a plurality of memory cells through a plurality of bit lines. The ADC circuit includes at least one ADC, and may be connected to a plurality of memory cells through a plurality of source lines. For example, when the ADC circuit includes a plurality of ADCs, the number of the plurality of ADCs may be the same as the number of the plurality of source lines.

FIG. 2B may be a diagram schematically illustrating a structure of a plurality of tiles 30 according to an example embodiment and another comparative example. Referring to FIG. 2B, in the comparative example, each of the plurality of tiles 30 may include a cell array 31, a row driver 32, a column driver 33, an analog to digital converter (ADC) circuit 34, and the like. A plurality of memory cells storing weights of the neural network may be provided in the cell array 31.

In an example embodiment, each of the plurality of memory cells may include a plurality of memory elements. For example, memory elements included in one memory cell may share a pair of active regions divided into a source region and a drain region, and each of the gate electrode layers may be included. For example, one memory cell may include a first active region and a second active region, a plurality of channel layers connected between the first active region and the second active region and separated from each other, a plurality of gate electrode layers corresponding to a plurality of channel layers, and the like. Similar to the plurality of channel layers, the plurality of gate electrode layers may be separated from each other.

In addition, in an example embodiment, a ferroelectric layer may be provided between the gate electrode layer and the channel layer in each of the memory elements. The ferroelectric layer may include a ferroelectric material, the polarization direction and degree of polarization of the ferroelectric layer may be changed by a voltage input to the first active region, the second active region and the gate electrode layer, and as a result, the threshold voltage of the memory element may change. As described above, in an example embodiment, by changing the threshold voltage of the memory element by adjusting the polarization direction of the ferroelectric layer, the weight of the neural network may be stored in the memory element.

When performing computational operations based on neural networks, the amount of current flowing through each of the memory elements included in one memory cell may be determined according to a threshold voltage of each of the memory elements. In addition, current flowing through each of the memory elements may be combined in one of the first active region and the second active region to form one output current. As previously described with reference to FIGS. 1A and 1B, each of the plurality of weights w1-$wn$ included in the neural network may be distributed and stored in two or more memory cells commonly connected to one of the plurality of bit lines and one of the plurality of source lines. As an example, each of the plurality of weights w1-$wn$ may be converted into digital data having a plurality of bits, the plurality of bits may be distributed and stored in two or more memory cells, and two or more memory cells may be commonly connected to one of the plurality of bit lines and one of the plurality of source lines.

In an operation for implementing an inference operation of a neural network, the row driver 32 may input an input voltage corresponding to one of the plurality of inputs a1-aN to one bit line to which two or more memory cells are commonly connected. Currents flowing through the two or more memory cells may be summed in one source line shared by the two or more memory cells and input to the ADC circuit 34. Accordingly, the current received by the ADC circuit 34 through one source line may correspond to the product of one of the plurality of inputs a1-an and one of the plurality of weights w1-wN.

When the output current received through one of the source lines SL1-SLn is greater than the reference current, the ADC circuit 34 may transmit the same to another tile corresponding to the next layer of the neural network. In an example embodiment, a result of multiplying each of the plurality of inputs a1-aN and the plurality of weights w1-wN may be output in the form of a current from the memory elements, and currents output from the memory elements may be summed from the memory cell and the source line. Accordingly, the semiconductor device 20 suitable for supporting computation based on the neural network may be implemented.

Figure 3:
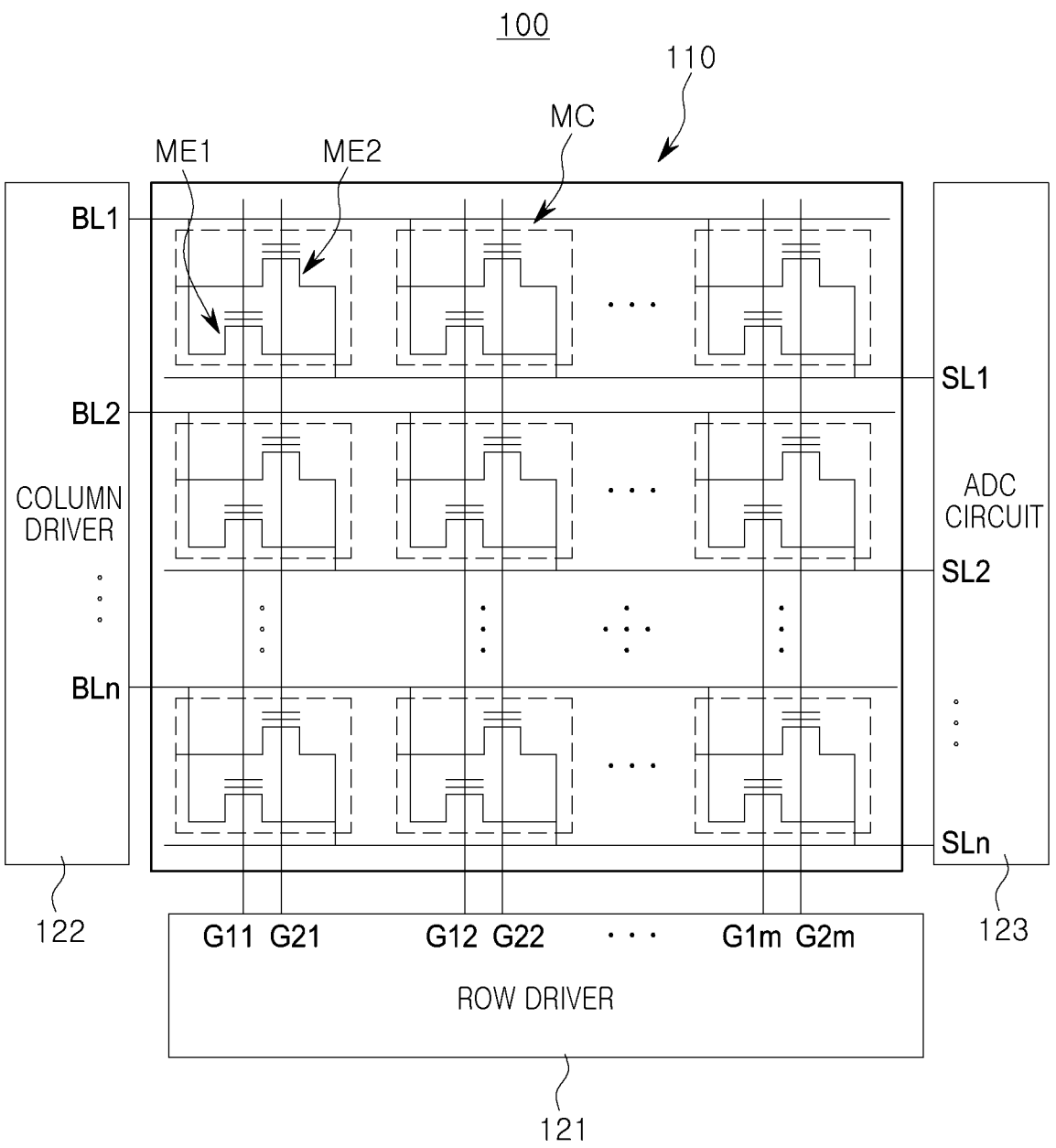
FIG. 3 is a diagram schematically illustrating a semiconductor device according to an example embodiment.

FIG. 3 is a schematic diagram illustrating a semiconductor device according to an example embodiment.

Referring to FIG. 3, a semiconductor device 100 according to an example embodiment may include a cell array 110 and a row driver 121, a column driver 122, an ADC circuit 123. However, the disclosure is not limited thereto, and as such, according to another example embodiment, the semiconductor device 100 may include other components. The cell array 110 may be included in the cell region and may include a plurality of memory cells MC arranged in an array form.

Each of the plurality of memory cells MC may include a plurality of memory elements ME1 and ME2. FIG. 3 illustrates that the first memory element ME1 and the second memory element ME2 are included in each of the plurality of memory cells MC according to an example embodiment. However, the disclosure is not limited thereto, and as such, according to another example embodiment, three or more memory elements may be included in each of the plurality of memory cells MC.

The first memory element ME1 and the second memory element ME2 included in each of the plurality of memory cells MC may share active regions including a drain region and a source region. Referring to FIG. 3, the first memory element ME1 and the second memory element ME2 may share a drain region connected to one of the bit lines BL1-BLn, and a source region connected to one of the source lines SL1-SLn. For example, the plurality of bit lines BL1-BLn may be connected to the column driver 122, and the plurality of source lines SL1-SLn may be connected to the ADC circuit 123.

The row driver 121 may be connected to the plurality of memory cells MC through the plurality of gate lines G11, G21, G12, G22 . . . G1$m$G2$m$. For example, in the example embodiment illustrated in FIG. 3, the first memory element ME1 and the second memory element ME2 included in one memory cell MC may be connected to different gate lines G11, G21, G12, G22 . . . G1$m$G2$m$. Accordingly, the first memory element ME1 and the second memory element ME2 included in each of the memory cells MC may be programmed to have different threshold voltages.

The first memory element ME1 and the second memory element ME2 may share a drain region connected to one of the bit lines BL1-BLn, and a source region connected to one of the source lines SL1-SLn, and the channel layer and the gate electrode layer may be separately provided. For example, the first memory element ME1 may include a first channel layer, a first gate electrode layer, and a first ferroelectric layer provided between the first channel layer and the first gate electrode layer, and the second memory element ME2 may include a second channel layer, a second gate electrode layer, and a second ferroelectric layer provided between the second channel layer and the second gate electrode layer.

The polarization direction and polarization degree of the first ferroelectric layer may be determined by the voltage input to the first gate electrode layer, and a polarization direction and a polarization degree of the second ferroelectric layer may be determined by a voltage input to the second gate electrode layer. Accordingly, the first memory element ME1 and the second memory element ME2 may have different threshold voltages.

FIGS. 4 to 7 are diagrams provided to explain an operation of a semiconductor device according to an example embodiment.

Figure 4:
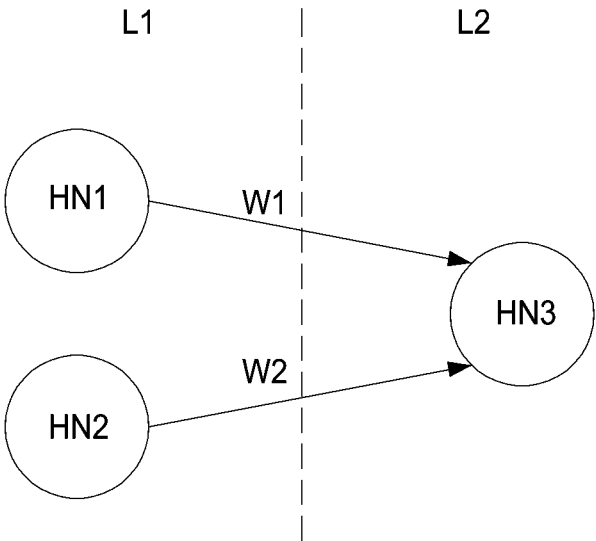
FIG. 4 is a diagram provided to explain an operation of a semiconductor device according to an example embodiment.

FIG. 4 may be a diagram illustrating a portion of a neural network supportable in a semiconductor device according to an example embodiment. Referring to FIG. 4, the first hidden node HN1 and the second hidden node HN2 included in the first layer L1 may be connected to the third hidden node HN3 of the second layer L2, and a first weight W1 and a second weight W2 may be assigned to each of the connection paths. A first multiplication result obtained by multiplying the first input value of the first hidden node HN1 by the first weight W1, and a second multiplication result obtained by multiplying the second input value of the second hidden node HN2 by the second weight W2 may be transmitted to the third hidden node HN3 and summed. Accordingly, a multiply-accumulate (MAC) operation may be performed between the first layer (L1) and the second layer (L2).

Figure 5:
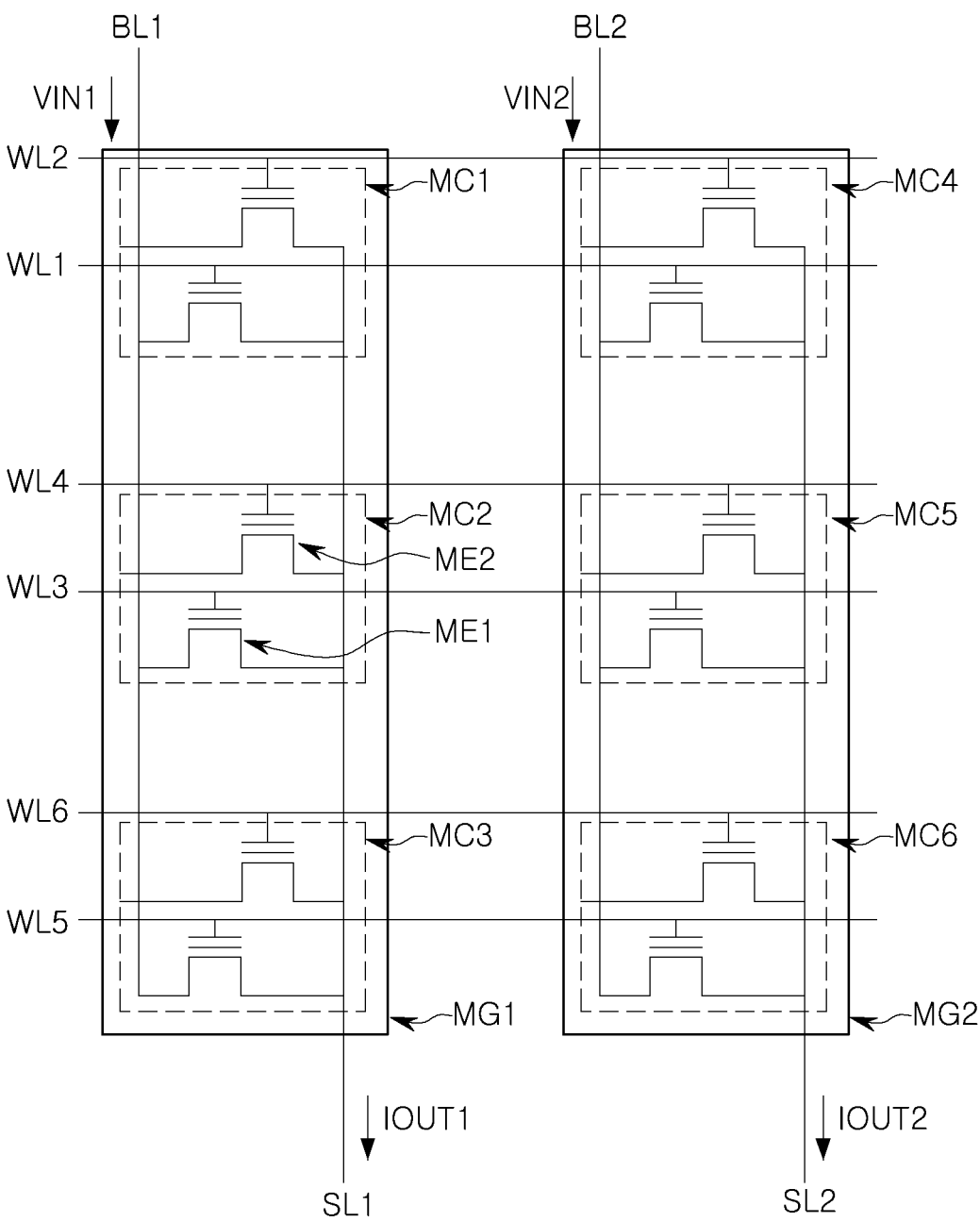
FIG. 5 is a diagram provided to explain an operation of a semiconductor device according to an example embodiment.

FIG. 5 is a diagram illustrating a partial configuration of a semiconductor device capable of executing the MAC operation described above with reference to FIG. 4 according to an example embodiment. Referring to FIG. 5, the first to third memory cells MC1 to MC3 may be connected to the first bit line BL1 and the first source line SL1, and the fourth to sixth memory cells MC4 to MC6 may be connected to the second bit line BL2 and the second source line SL2. The first to third memory cells MC1-MC3 may constitute a first memory cell group MG1, and the fourth to sixth memory cells MC4-MC6 may constitute the second memory cell group MG2.

On the other hand, the first memory cell MC1 and the fourth memory cell MC4 may share the first and second word lines WL1-WL2. The second memory cell MC2 and the fifth memory cell MC5 may share the third and fourth word lines WL3-WL4, and the third memory cell MC3 and the sixth memory cell MC6 may share fifth and sixth word lines WL5-WL6. The plurality of word lines WL1-WL6 may be connected to gates of memory elements included in the memory cells MC1-MC6.

For example, the first weight W1 may be stored in the first memory cell group MG1, and the second weight W2 may be stored in the second memory cell group MG2. The first to third memory cells MC1 to MC3 included in the first memory cell group MG1 storing the first weight W1 may be continuously provided in the direction in which the bit lines BL1 to BL2 and the source lines SL1 to SL2 extend. Similarly, the fourth to sixth memory cells MC4-MC6 storing the second weight W1 are also sequentially arranged in the extending direction of the bit lines BL1-BL2 and the source lines SL1-SL2.

For example, the first weight W1 in the form of a floating point may be converted into data of six (6) bits or less and stored in the first to third memory cells MC1 to MC3 of the first memory cell group MG1. The first memory cell group MG1 may include six memory elements programmable by individually changing a threshold voltage. When the first weight W1 is converted into 6-bit data, one (1) bit of data may be distributed and stored in each of the 6 memory elements.

A first input voltage VIN1 corresponding to a first input value output from the first hidden node HN1 may be input to the first bit line BL1 by a column driver. The threshold voltage of each of the six memory elements included in the first memory cell group MG1 may vary according to each bit of the 6-bit data obtained by converting the first weight W1. Accordingly, currents flowing through at least some of the six memory elements may be different from each other.

The first memory cell group MG1 may output the first output current IOUT1 through the first source line SL1. The first output current IOUT1 may correspond to the sum of individual currents flowing through each of the six memory elements included in the first memory cell group MG1. Accordingly, the ADC connected to the first source line SL1 may receive the first output current IOUT1 corresponding to the multiplication of the first weight W1 and the first input value.

Similarly, the second input voltage VIN2 corresponding to the second input value output from the second hidden node HN2 may be input to the second bit line BL2 connected to the second memory cell group MG2. On the other hand, data obtained by converting the second weight W2 may be stored for each bit in the six memory elements included in the second memory cell group MG2. Accordingly, the ADC connected to the second source line SL2 may receive the second output current IOUT2 corresponding to the multiplication of the second weight W2 and the second input value.

Figure 6:
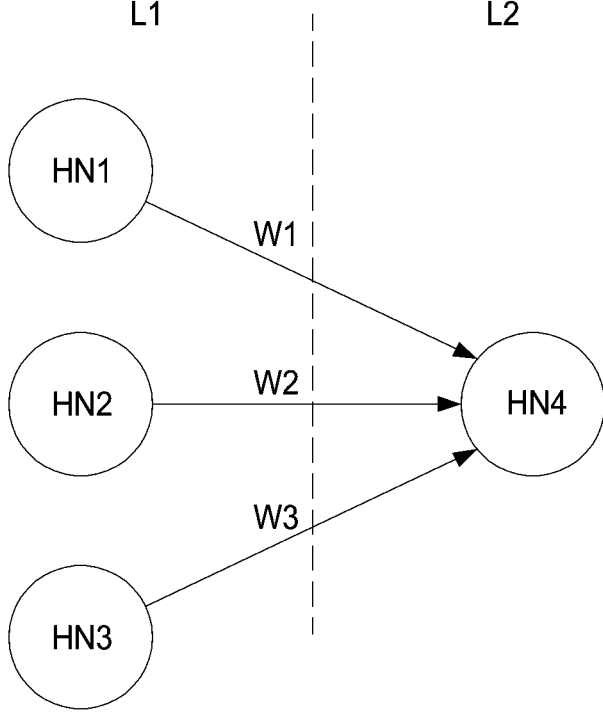
FIGS. 6 and 7 are diagrams provided to explain an operation of a semiconductor device according to an example embodiment.

FIG. is a diagram illustrating a portion of a neural network supportable in a semiconductor device according to an example embodiment. Referring to FIG. 6, the first hidden node HN1, the second hidden node HN2, and the third hidden node HN3 included in the first layer L1 may be connected to the fourth hidden node HN4 of the second layer L2, and a first weight W1, a second weight W2, and a third weight W3 may be allocated to the connection paths, respectively. The first multiplication result obtained by multiplying the first input value of the first hidden node HN1 by the first weight W1, a second multiplication result obtained by multiplying the second input value of the second hidden node HN2 by the second weight W2, and the third multiplication result obtained by multiplying the third input value of the third hidden node HN3 by the third weight W3 may be transmitted to the fourth hidden node HN4 and summed.

Figure 7:
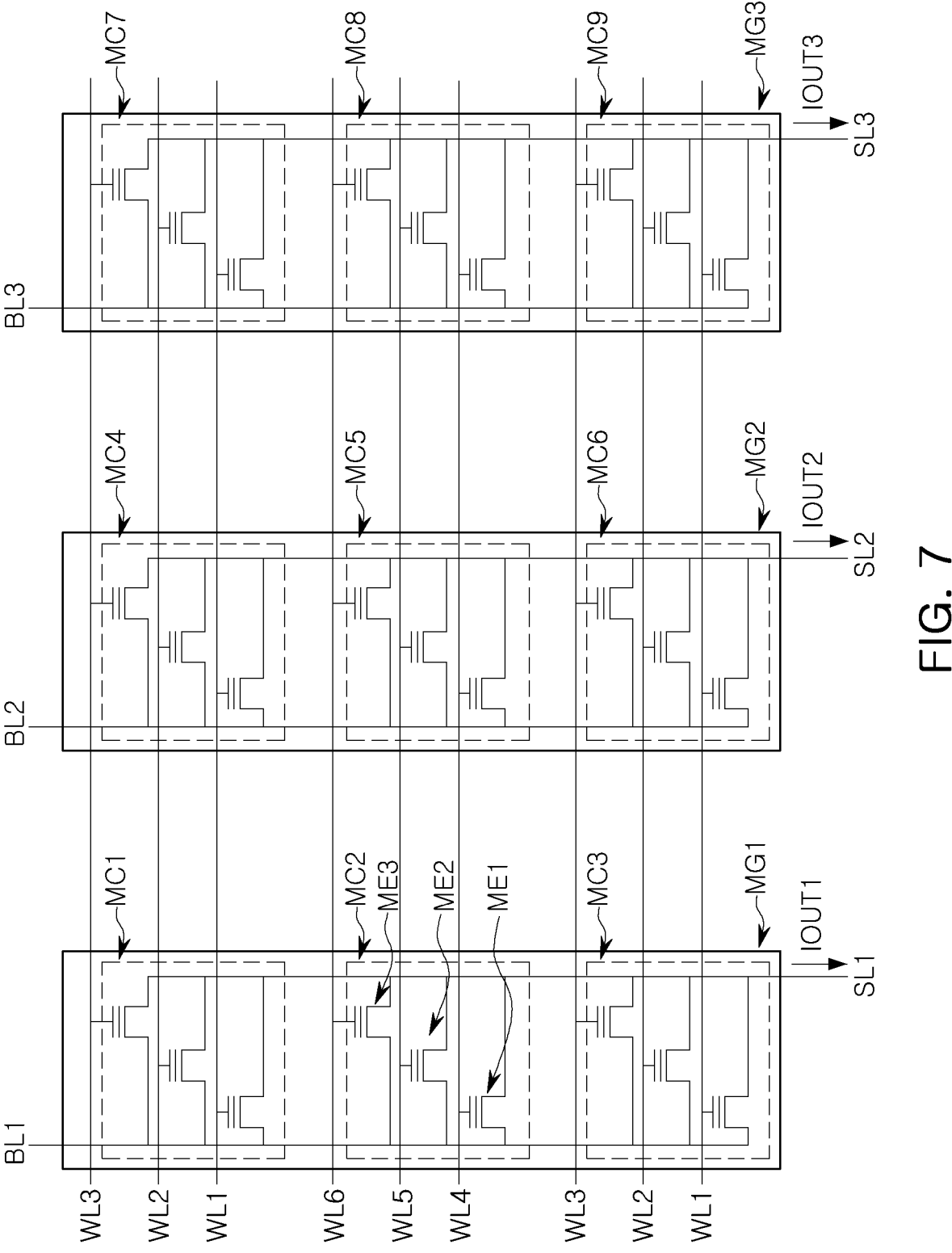

FIG. 7 is a diagram illustrating a partial configuration of a semiconductor device capable of executing a MAC operation between the first layer L1 and the second layer L2 described above with reference to FIG. 6. Referring to FIG. 7, the first to third memory cells MC1 to MC3 may be connected to the first bit line BL1 and the first source line SL1, and the fourth to sixth memory cells MC4-MC6 may be connected to the second bit line BL2 and the second source line SL2. Moreover, the seventh to ninth memory cells MC7-MC9 may be connected to the third bit line BL3 and the third source line SL3.

According to an example embodiment, the first memory cell MC1, the fourth memory cell MC4, and the seventh memory cell MC7 may share the first to third word lines WL1-WL3. The second memory cell MC2, the fifth memory cell MC5, and the eighth memory cell MC8 may share fourth to sixth word lines WL4-WL6. The third memory cell MC3, the sixth memory cell MC6, and the ninth memory cell MC9 may share the seventh to ninth word lines WL7-WL9. The plurality of word lines WL1-WL9 may be connected to gates of memory elements included in the memory cells MC1-MC9.

The first to third memory cells MC1-MC3 may constitute a first memory cell group MG1, and the fourth to sixth memory cells MC4 to MC6 may constitute a second memory cell group MG2. The seventh to ninth memory cells MC7-MC9 may constitute a third memory cell group MG3. On the other hand, in the example embodiment illustrated in FIG. 7, each of the memory cells MC1-MC9 may include first to third memory elements ME1-ME3.

Similar to the description above with reference to FIG. 5, the first weight W1 may be stored in the first memory cell group MG1, the second weight W2 may be stored in the second memory cell group MG2, and the third weight W3 may be stored in the third memory cell group MG3. In the example embodiment illustrated in FIG. 7, each of the memory cells MC1-MC9 may include the first to third memory elements ME1-ME3, and each of the first to third weights W1 to W3 may be converted into data of up to 9 bits and stored in the memory cells MC1 to MC9. Therefore, the first to third weights W1-W3 may be converted into data of higher resolution and stored, thereby improving the accuracy of the MAC operation executed in the semiconductor device.

For example, the first weight W1 may be converted into 9-bit data, and the 9 bits may be stored in each of the 9 memory elements included in the first memory cell group MG1. In detail, each of the memory elements may store 1 bit of data.

A first input voltage VIN1 corresponding to a first input value output from the first hidden node HN1 may be input to the first bit line BL1. A threshold voltage of each of the nine memory elements included in the first memory cell group MG1 may vary according to each bit of 9-bit data corresponding to the first weight W1. Accordingly, currents flowing through at least some of the nine memory elements may be different from each other.

The first memory cell group MG1 may output the first output current IOUT1 through the first source line SL1. The first output current IOUT1 may correspond to the sum of individual currents flowing through each of the nine memory elements included in the first memory cell group MG1. Accordingly, the ADC connected to the first source line SL1 may receive the first output current IOUT1 corresponding to the multiplication of the first weight W1 and the first input value.

Similarly, the second input voltage VIN2 corresponding to the second input value output from the second hidden node HN2 may be input to the second bit line BL2 connected to the second memory cell group MG2. The ADC connected to the second source line SL2 may receive the second output current IOUT2 corresponding to the multiplication of the second weight W2 and the second input value. A third input voltage VIN3 corresponding to a third input value output from the third hidden node HN3 may be input to the third bit line BL3 connected to the third memory cell group MG3. The ADC connected to the third source line SL3 may receive the third output current IOUT3 corresponding to the multiplication of the third input value and the third weight W3.

FIGS. 8A to 8D are diagrams illustrating a semiconductor device according to an example embodiment.

Figure 8A:
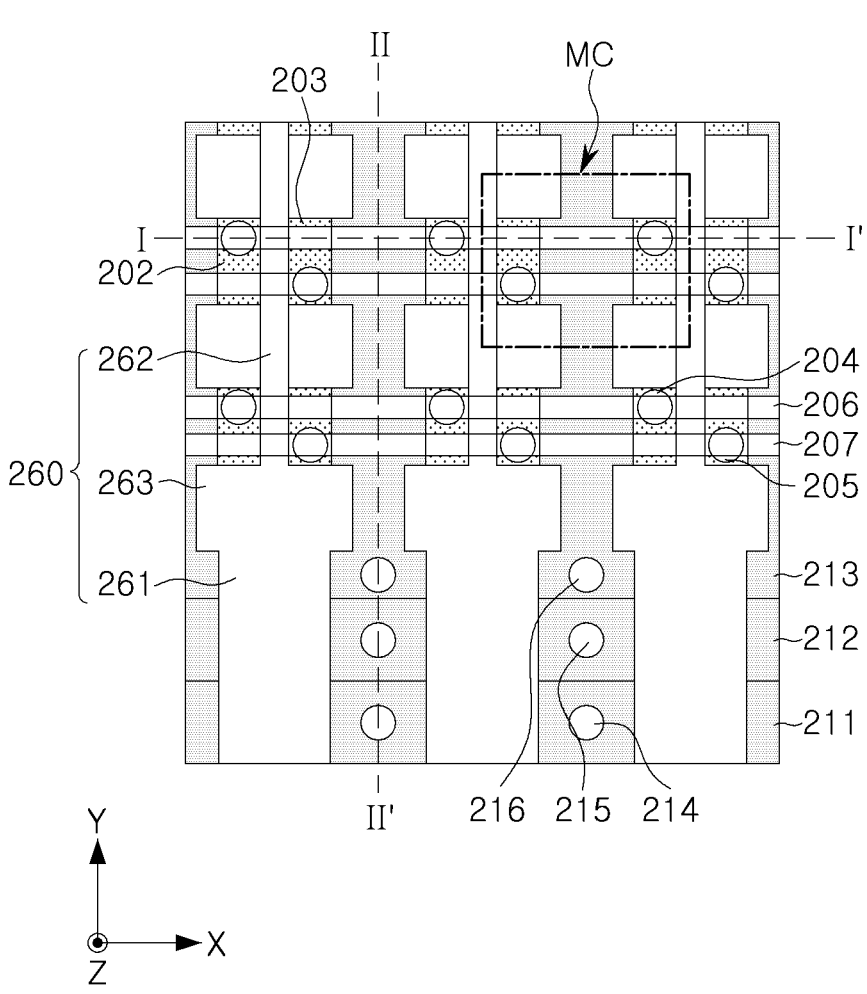
FIGS. 8A to 8D are diagrams illustrating a semiconductor device according to an example embodiment.
Figure 8B:
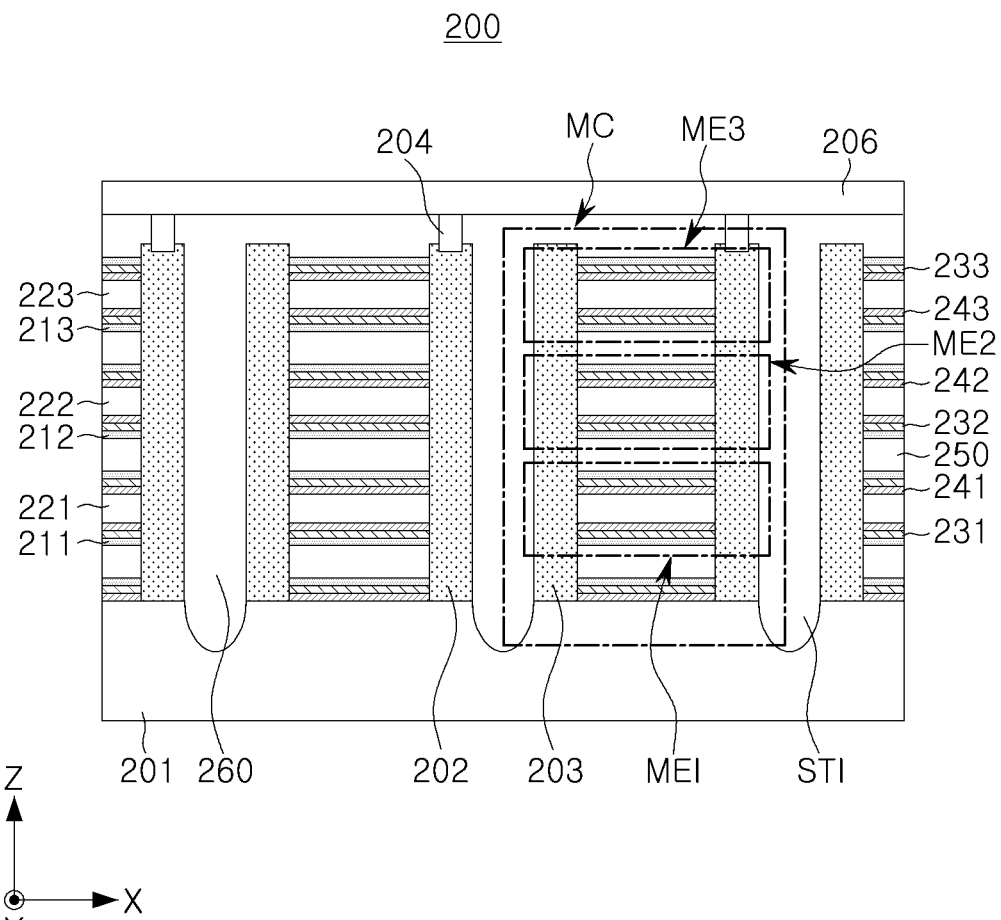
Figure 8C:
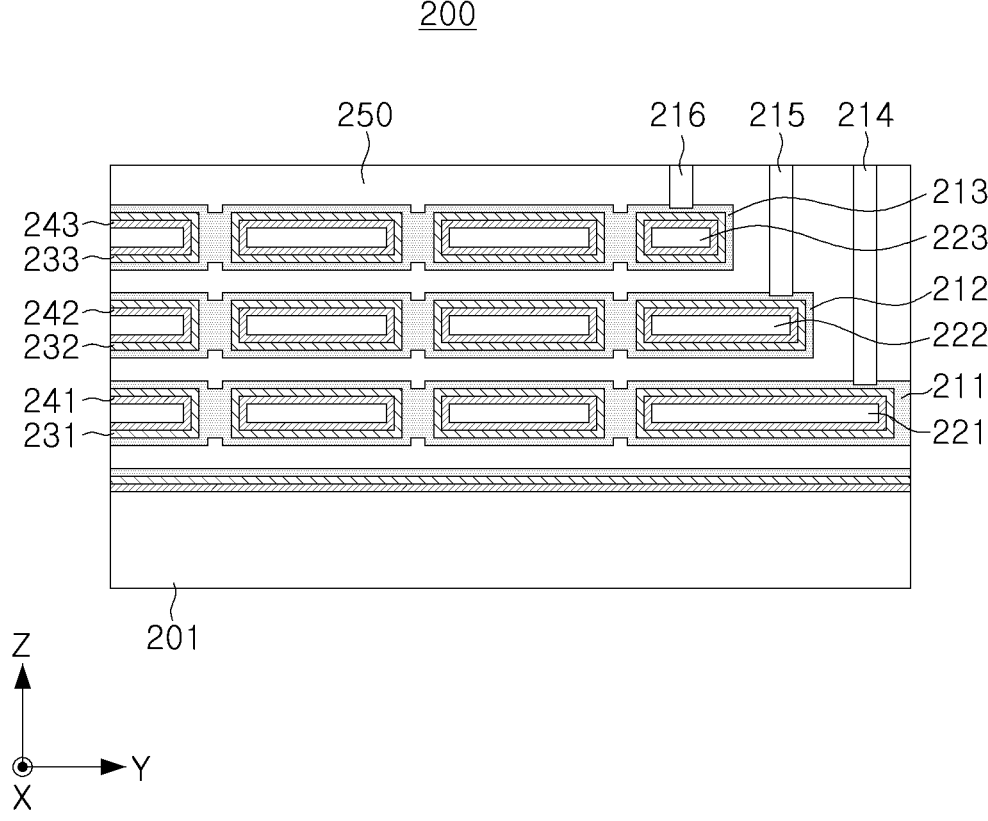

FIG. 8A is a plan view illustrating a partial region of the semiconductor device 200 according to an example embodiment, and FIG. 8B may be a cross-sectional view illustrating a cross-section in the direction I-I' of FIG. 8A. FIG. 8C may be a cross-sectional view illustrating a cross-section in a direction II-II' of FIG. 8A. 8A to 8C may be views illustrating a portion of a cell region in which memory cells MC are provided in the semiconductor device 200.

Referring to FIGS. 8A to 8C, in the semiconductor device 200 according to the example embodiment, the plurality of memory cells MC are provided in a first direction (X-axis direction) and a second direction (Y-axis direction) parallel to the upper surface of the substrate 201. According to an example embodiment, the plurality of memory cells MC may be arranged along two directions. Each of the plurality of memory cells MC may include a first active region 202 and a second active region 203 adjacent to each other in a first direction, a plurality of channel layers 221-223 extending in a first direction between the first active region 202 and the second active region 203, a plurality of ferroelectric layers 231-233 and a plurality of gate electrode layers 211-213 are sequentially provided on the plurality of channel layers 221-223, and the like. Also, a plurality of gate insulating layers 241-243 may be provided between the plurality of channel layers 221-223 and the plurality of ferroelectric layers 231-233.

Referring to FIGS. 8A to 8C, each of the plurality of memory cells MC has a first channel layer 221, a second channel layer 222 and a third channel layer 223 separated from each other in a third direction (Z-axis direction) perpendicular to the upper surface of the substrate 201. However, the number of the channel layers may vary according to other example embodiments. For example, each of the plurality of memory cells MC may include only two channel layers or may include four or more channel layers. An interlayer insulating layer 250 may be provided between the plurality of channel layers 221 to 223 in the third direction, and the interlayer insulating layer 250 may be formed of an insulating material such as silicon oxide, silicon nitride, or silicon oxynitride.

For example, the first channel layer 221 may be connected to the first active region 202 and the second active region 203 at both sides in the first direction, and may include a semiconductor material. A first ferroelectric layer 231 and a first gate electrode layer 211 may be sequentially provided on the first channel layer 221. For example, the first ferroelectric layer 231 may include a ferroelectric material such as Hafnium (Hf), zirconium (Zr), silicon (Si), yttrium (Y), aluminum (Al), gadolinium (Gd), strontium (Sr), lanthanum (La), scandium (Sc), and oxides thereof. A first gate insulating layer 241 may be provided between the first ferroelectric layer 231 and the first channel layer 221, and the first gate insulating layer may be formed of silicon oxide or the like.

Referring to FIGS. 8B and 8C, the first channel layer 221 may extend in the first direction to be connected to the first active region 202 and the second active region 203 and simultaneously extend in the second direction. Also, as illustrated according to an example embodiment in FIG. 8C, the first channel layer 221 may be surrounded by the first gate insulating layer 241, the first ferroelectric layer 231, and the first gate electrode layer 211 in the second and third directions. Since the plurality of memory cells MC are arranged in the first direction and the second direction, the first channel layer 221 included in each of the memory cells MC adjacent to each other in the second direction may be separated from each other. On the other hand, the first gate electrode layer 211 included in the memory cells MC provided at the same position in the first direction and at the same height in the third direction may be connected as one in the second direction, as illustrated in FIG. 8C.

The structures of the second channel layer 222 and the third channel layer 223 and the periphery thereof may be similar to those described above with respect to the first channel layer 221. For example, the second channel layer 222 may be surrounded by the second gate insulating layer 242, the second ferroelectric layer 232, and the second gate electrode layer 212 provided in order, in the second direction and the third direction. The second channel layers 222 provided at the same position in the first direction and at the same height in the third direction and adjacent in the second direction are separated from each other, while one second gate electrode layer 212 may surround the second channel layers 222 adjacent in the second direction.

In each of the memory cells MC, since the channel layers 221 to 223 and the gate electrode layers 211 to 213 are separated from each other, each of the memory cells MC may include a plurality of memory elements ME1-ME3. For example, the first memory element ME1 may include a first gate electrode layer 211, a first channel layer 221, a first ferroelectric layer 231, a first gate insulating layer 241, a first active region 202, and a second active region 203. The second memory element ME2 may include a second gate electrode layer 212, a second channel layer 222, a second ferroelectric layer 232, a second gate insulating layer 242, a first active region 202, and a second active region 203. The third memory element ME3 may include a third gate electrode layer 213, a third channel layer 223, a third ferroelectric layer 233, a third gate insulating layer 243, a first active region 202, and a second active region 203.

Accordingly, in each of the memory cells MC, the memory elements ME1-ME3 share the first active region 202 and the second active region 203, and thus, it may be understood that the memory elements ME1-ME3 are connected to each other in parallel. However, since the gate electrode layers 211 to 213 are separated from each other and extend to different lengths in the second direction to be respectively connected to the plurality of gate contacts 214 to 216, the memory elements ME1-ME3 may be programmed to have different threshold voltages.

For example, by inputting a positive voltage greater than zero to the first gate electrode layer 211 of the memory cell MC and inputting a voltage of zero (0)V to each of the first active region 202 and the second active region 203, the polarization state of the first ferroelectric layer 231 is changed and the threshold voltage of the first memory element ME may be reduced. At this time, by inputting a voltage of 0 V to the second gate electrode layer 212 and the third gate electrode layer 213, the polarization state of each of the second ferroelectric layer 232 and the third ferroelectric layer 233 may be maintained as it is.

Referring back to FIGS. 8A and 8B, the first active region 202 may be connected to one of the plurality of source lines 206 through a source line contact 204, and the second active region 203 may be connected to one of the plurality of bit lines 207 through the bit line contact 205. The plurality of source lines 206 and the plurality of bit lines 207 may extend in the first direction. The plurality of source lines 206 may be connected to the ADC circuit, and the plurality of bit lines 207 may be connected to the column driver.

One of the plurality of source lines 206 and one of the plurality of bit lines 207 may be provided above the first active region 202 and the second active region 203, and the source line contact 204 and the bit line contact 205 may be provided in different positions in the second direction. In an example embodiment illustrated in FIG. 8A, the source line contact 204 may be provided above the bit line contact 205 in the second direction in each of the memory cells MC. Accordingly, the plurality of source lines 206 and the plurality of bit lines 207 may be alternately provided in the second direction without interference.

On the other hand, the plurality of gate electrode layers 211-213 may be defined as word lines extending in the second direction. The plurality of gate electrode layers 211-213 may be connected to the row driver through the plurality of gate contacts 214-216. At least one gate electrode layer connected to the memory cells MC in which weight data corresponding to the weight of the neural network is to be stored may be selected from among the plurality of gate electrode layers 211-213. In addition, the row driver may select at least one gate electrode layer connected to the memory cells MC in which the necessary weights are stored in order to execute the MAC operation required for the reasoning operation using the neural network.

The semiconductor device 200 may include a vertical insulating layer 260. For example, referring to FIG. 8A, the vertical insulating layer 260 may include a first vertical insulating layer 261, a second vertical insulating layer 262 and a third vertical insulating layer 263, and each of the first to third vertical insulating layers 261-263 may have different widths in the first direction. For example, the second vertical insulating layer 262 may have the smallest width, and the third vertical insulating layer 263 may have the largest width. The vertical insulating layer 260 may be formed of at least one of silicon oxide, silicon nitride, and silicon oxynitride, and for example, may be formed of the same material as the interlayer insulating layer 250. The third vertical insulating layer 263 may be an active insulating layer that separates the adjacent active regions 202 and 203 from each other in the second direction.

According to an example embodiment, the first vertical insulating layer 261 is adjacent to the gate contacts 214-216 in the first direction, and includes the gate electrode layers 211-213 and the channel layers 221-223, and the like, separable from each other in the first direction. On the other hand, the second vertical insulating layer 262 is included in different memory cells MC and may be provided between the first active region 202 and the second active region 203 adjacent in the first direction. The third vertical insulating layer 263 may be provided between the first vertical insulating layer 261 and the second vertical insulating layer 262 in the second direction. For example, a boundary between memory cells MC adjacent to each other in the first direction may be determined by the second vertical insulating layer 262, and a boundary between the memory cells MC adjacent to each other in the second direction may be determined by the third vertical insulating layer 263. A partial region of the second vertical insulating layer 262 may be formed to recess at least a portion of the substrate 201 to provide the isolation insulating layer STI.

As described above, in an example embodiment, the threshold voltage of each of the memory elements ME included in each of the memory cells MC may be individually adjusted. Accordingly, each of the memory element ME may be programmed independently of each other. For example, data may be programmed in each of the memory elements ME by changing the polarization state of each of the ferroelectric layers 231-233. Hereinafter, a method of programming each of the memory elements ME by controlling the polarization state of the ferroelectric layers 231-233 will be described with reference to FIG. 8D together.

Figure 8D:
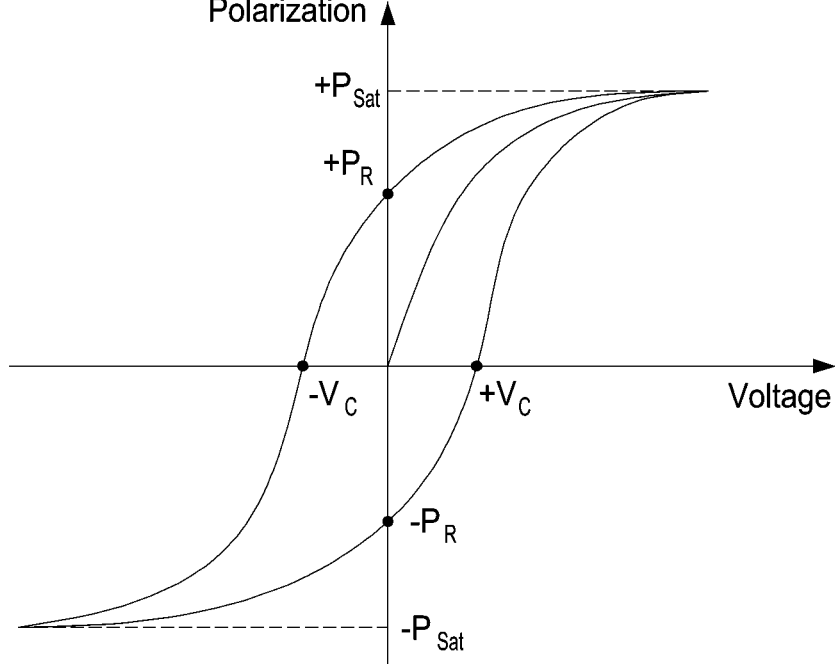

FIG. 8D illustrates a hysteresis curve of a ferroelectric material included in the ferroelectric layers 231-233 of the memory elements ME1-ME3 in the semiconductor device 200 according to an example embodiment. Referring to FIG. 8D, if no voltage is applied to the gate electrode layers 211 to 213 and an electric field is not applied to the ferroelectric layers 231-233, polarization may not occur.

For example, when the voltage input to the first gate electrode layer 211 of the gate electrode layers 211 to 213 increases in a positive direction, the polarization degree of the first ferroelectric layer 231 may reach a positive maximum point (+PSat), which is a saturation polarization point in a positive polarization region from 0. Then, even if the voltage input to the first gate electrode layer 211 is cut off, the degree of polarization does not decrease to zero and may stay at the positive residual point (+PR), which is the remnant polarization point.

On the other hand, when the voltage input to the first gate electrode layer 211 increases in a negative direction, the degree of polarization may shift from a positive residual point (+PR) to a negative maximum point (−PSat) in the negative polarization region. In this case, the ferroelectric material included in the first ferroelectric layer 231 may be polarized in a direction opposite to the polarization direction at the positive maximum point (+PSat). Thereafter, even if the negative voltage input to the first gate electrode layer 211 is cut off, the polarization degree does not change to 0 and may remain at the negative residual point (−PR).

As such, to change the polarization direction of each of the ferroelectric layers 231-233, a voltage should be applied in the opposite direction, and this voltage may be defined as a coercive voltage ((+VC, −VC). As an example, the coercive voltages (+VC, −VC) may be proportional to the thickness of each of the ferroelectric layers 231-233 and the coercive field of the ferroelectric material.

Figure 9A:
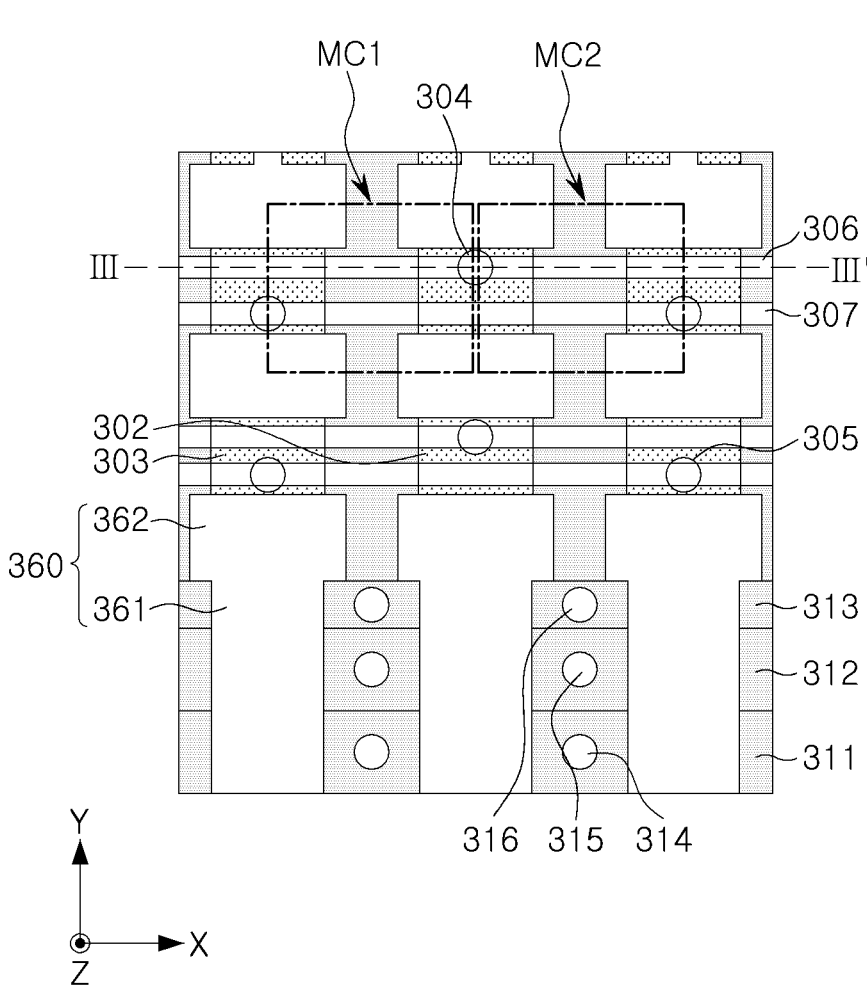
FIGS. 9A and 9B are schematic views of a semiconductor device according to an example embodiment.
Figure 9B:
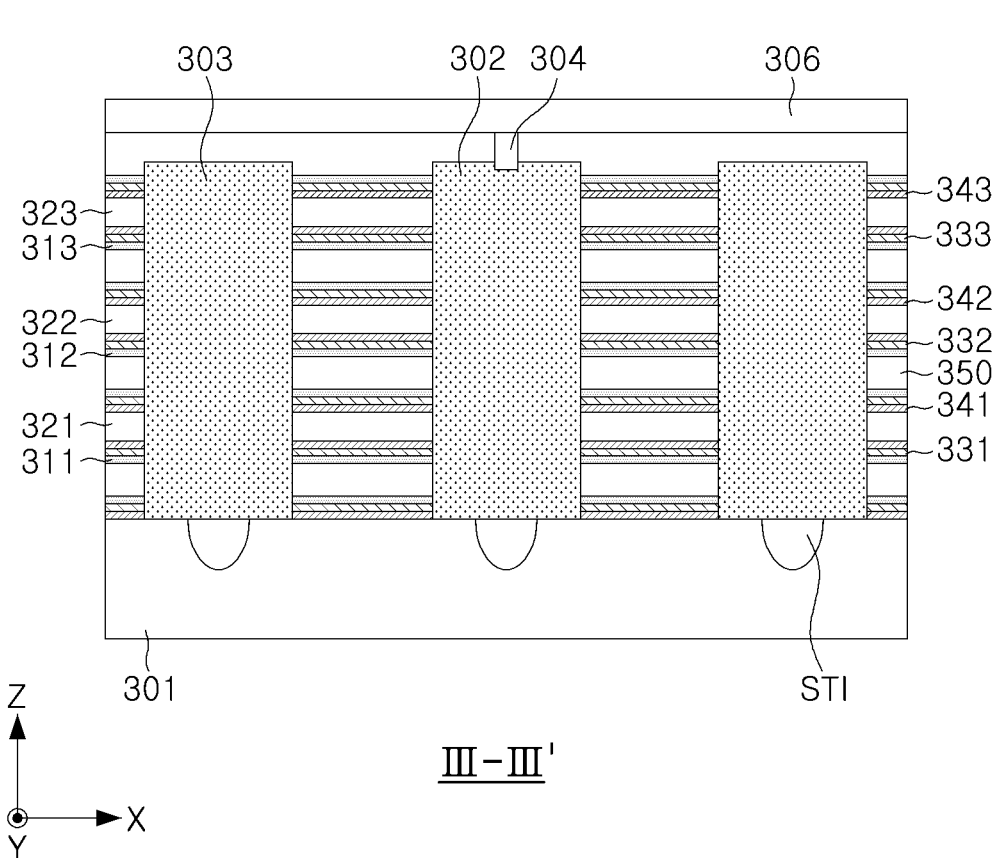

FIGS. 9A and 9B are diagrams illustrating a semiconductor device according to an example embodiment.

FIG. 9A is a plan view illustrating a partial region of the semiconductor device 300 according to an example embodiment, and FIG. 9B may be a cross-sectional view illustrating a cross-section in a direction of FIGS. 9A. 9A and 9B, in the semiconductor device 300 according to an example embodiment, and the plurality of memory cells may be arranged in a first direction (X-axis direction) and a second direction (Y-axis direction) parallel to the upper surface of the substrate 301.

Each of the plurality of memory cells may include a first active region 302 and a second active region 303 adjacent to each other in a first direction, a plurality of channel layers 321-323 extending in a first direction between the first active region 302 and the second active region 303, a plurality of ferroelectric layers 331-333 and a plurality of gate electrode layers 311-313 are sequentially provided on the plurality of channel layers 321-323. Also, a plurality of gate insulating layers 341-343 may be provided between the plurality of channel layers 321-323 and the plurality of ferroelectric layers 331-333.

Similar to that described above with reference to FIGS. 8A to 8C, the gate electrode layers 311-313 may extend to different lengths along the second direction to be connected to the gate contacts 314 to 316. Also, the channel layers 321-323 may be separated from each other in a third direction perpendicular to the upper surface of the substrate 301. An interlayer insulating layer 350 may be provided between the channel layers 321-323 in the third direction, and each of the gate electrode layers 311-313 may be divided into a plurality of regions by the vertical insulating layer 360 in the first direction.

The vertical insulating layer 360 may include a first vertical insulating layer 361 adjacent the gate contacts 314-316 in a first direction, and a second vertical insulating layer 362 provided between the active regions 302, 303 in a second direction. The second vertical insulating layer 362 may have a width greater than that of the first vertical insulating layer 361 in the first direction.

Referring to FIGS. 9A and 9B, the memory cells adjacent in the first direction may share the active regions 302 and 303. For example, referring to FIG. 9A, the first memory cell MC1 and the second memory cell MC2 may be adjacent to each other in the first direction and may share one first active region 302. The first active region 302 shared by the first memory cell MC1 and the second memory cell MC2 may be a source region connected to one of the source lines 306 through the source line contact 304.

The first memory cell MC1 may share a second active region 303 serving as a drain region with memory cells other than the second memory cell MC2. The second active region 303 may be connected to one of the bit lines 307 through the bit line contact 305. Since the memory cells sharing one of the active regions 302 and 303 include gate electrode layers 311-313 that are separated from each other, each of the memory cells may be controlled independently of each other regardless of whether the active regions 302 and 303 are shared.

FIGS. 10 to 33 are views provided to explain a method of manufacturing a semiconductor device according to an example embodiment.

Figure 10:
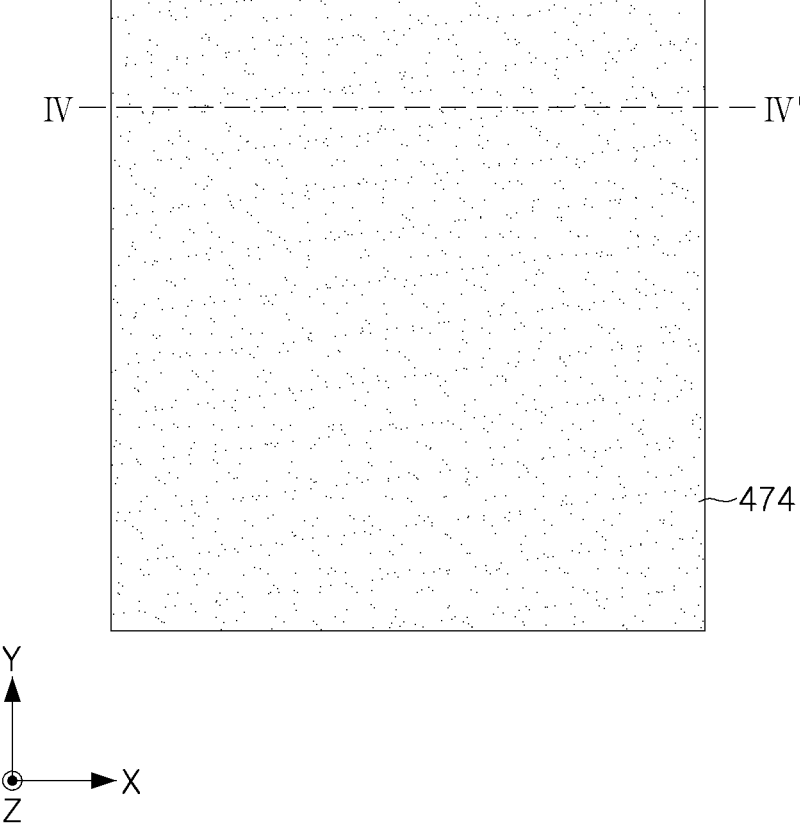
FIGS. 10 to 33 are diagrams provided to explain a method of manufacturing a semiconductor device according to an example embodiment.
Figure 11:
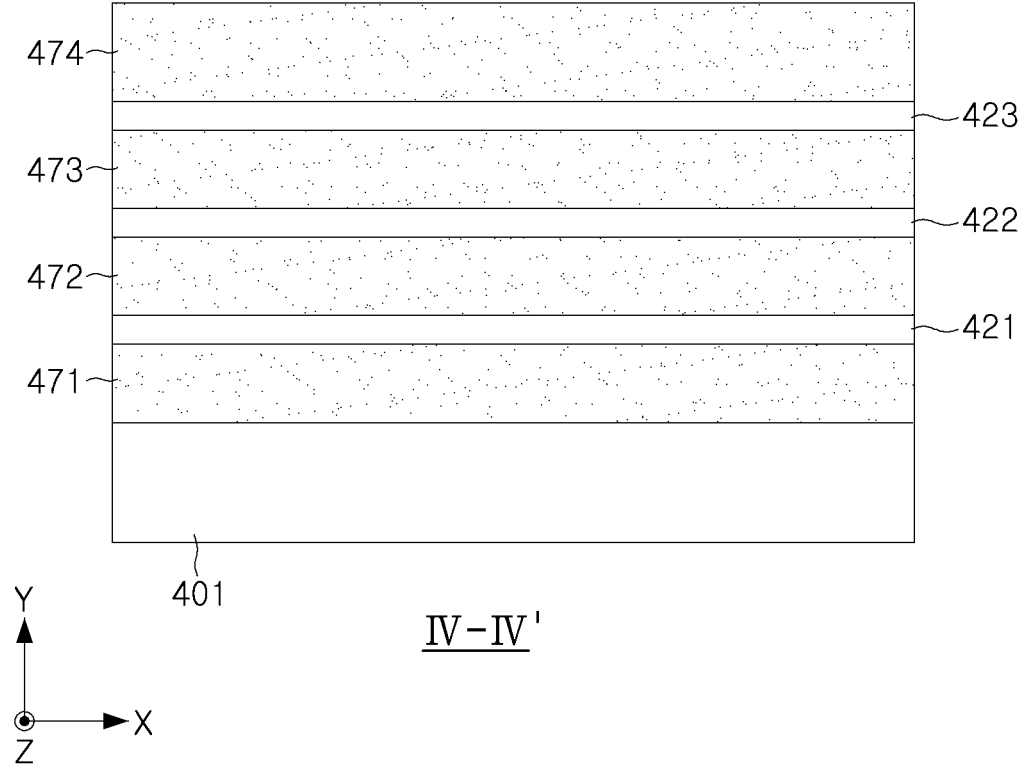

Referring to FIG. 10 and FIG. 11, which is a cross-sectional view taken in the IV-IV' direction of FIG. 10, a plurality of channel layers 421-423 and a plurality of horizontal sacrificial layers 471-474 are formed on a semiconductor substrate 401. According to an example embodiment, the plurality of channel layers 421-423 and the plurality of horizontal sacrificial layers 471-474 may be alternately stacked. The plurality of channel layers 421-423 and the plurality of horizontal sacrificial layers 471-474 may be formed of different materials. For example, each of the plurality of channel layers 421-423 may be formed of silicon (Si), and each of the plurality of horizontal sacrificial layers 471-474 may be formed of silicon germanium (SiGe). The thickness of each of the plurality of channel layers 421-423 and the plurality of horizontal sacrificial layers 471-474 may be variously modified according to embodiments.

Figure 12:
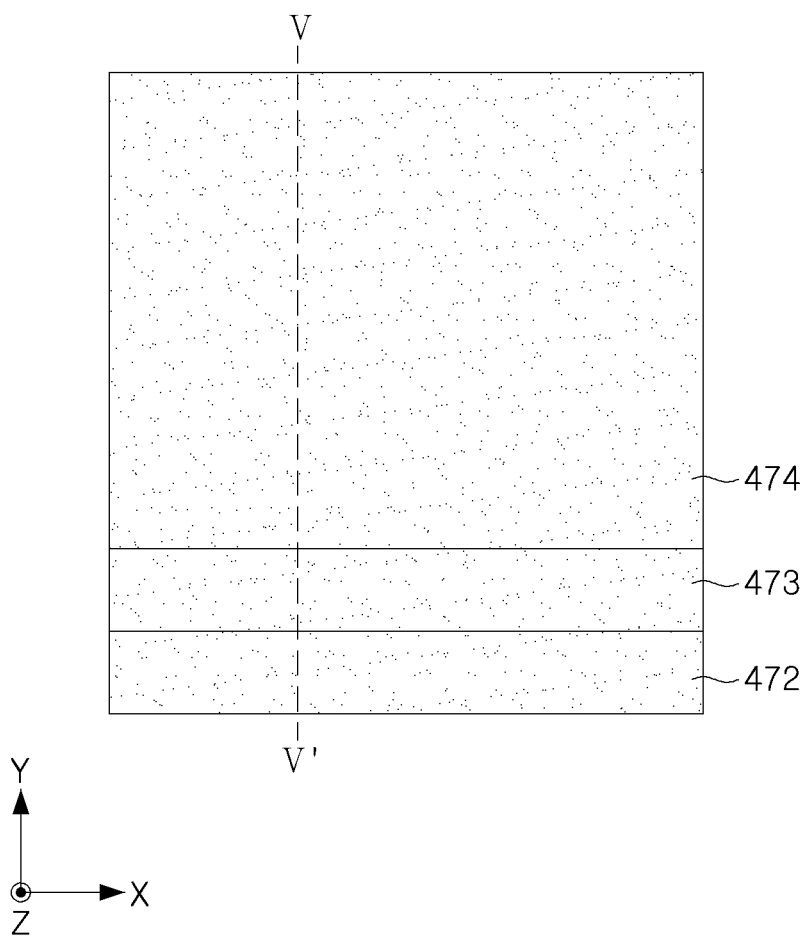
Figure 13:
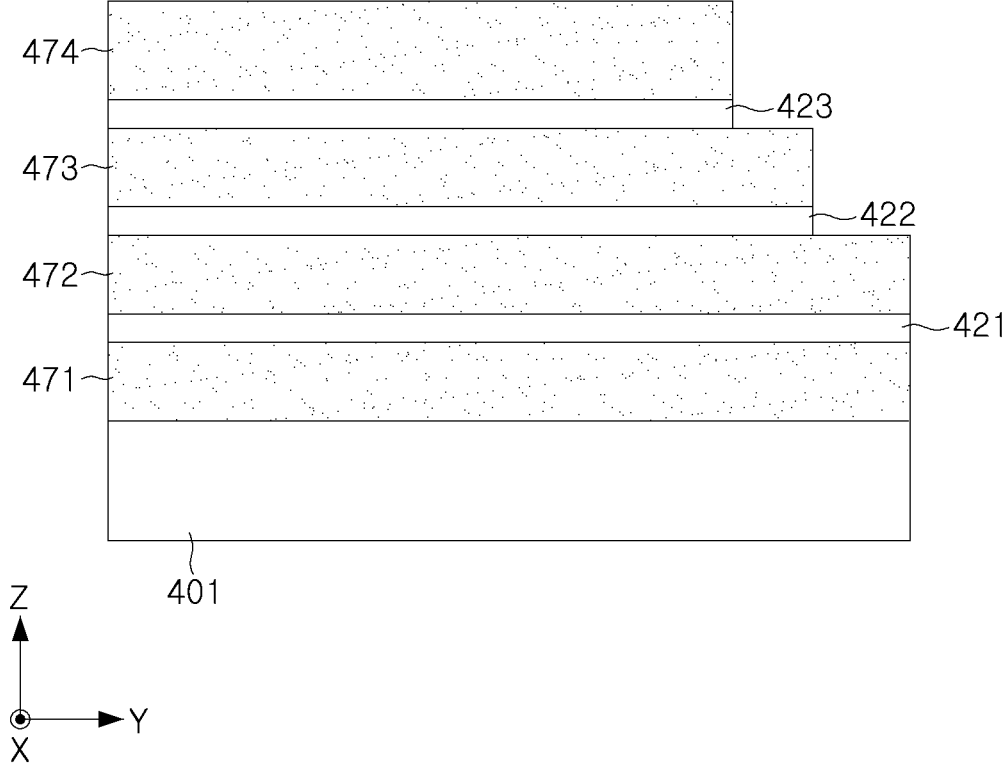

Next, referring to FIG. 12 and FIG. 13, which is a cross-sectional view taken in the V-V' direction of FIG. 12, at least some of the plurality of channel layers 421-423 and the plurality of horizontal sacrificial layers 471-474 may be etched. For example, the etching process may be performed such that some of the plurality of channel layers 421-423 and the plurality of horizontal sacrificial layers 471-474 have different lengths in the second direction (Y-axis direction) as illustrated in FIG. 13.

Referring to FIG. 13, the first horizontal sacrificial layer 471, the first channel layer 421, and the second horizontal sacrificial layer 471 may be provided at the lowest position in the third direction (Z-axis direction) perpendicular to the upper surface of the substrate 401. The sacrificial layer 472 may have the longest length in the second direction. The second channel layer 422 and the third horizontal sacrificial layer 473 may be etched to have a shorter length than the first channel layer 421 in the second direction, and accordingly, a portion of the upper surface of the second horizontal sacrificial layer 472 may be exposed to the outside. The third channel layer 423 and the fourth horizontal sacrificial layer 474 are etched to have a shorter length than the second channel layer 422 in the second direction, and accordingly, a portion of the upper surface of the third horizontal sacrificial layer 473 may be exposed to the outside.

Figure 14:
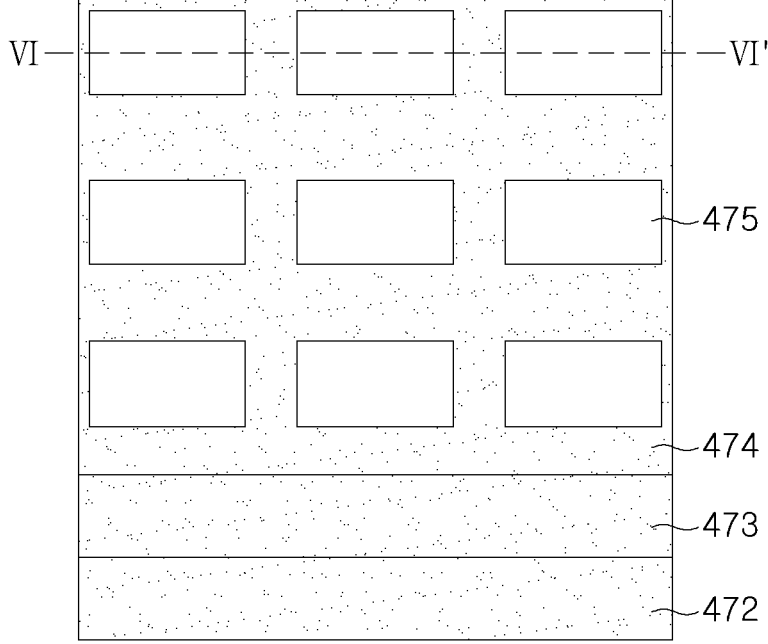
Figure 14:
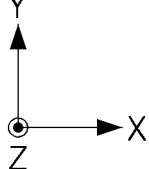
Figure 15:
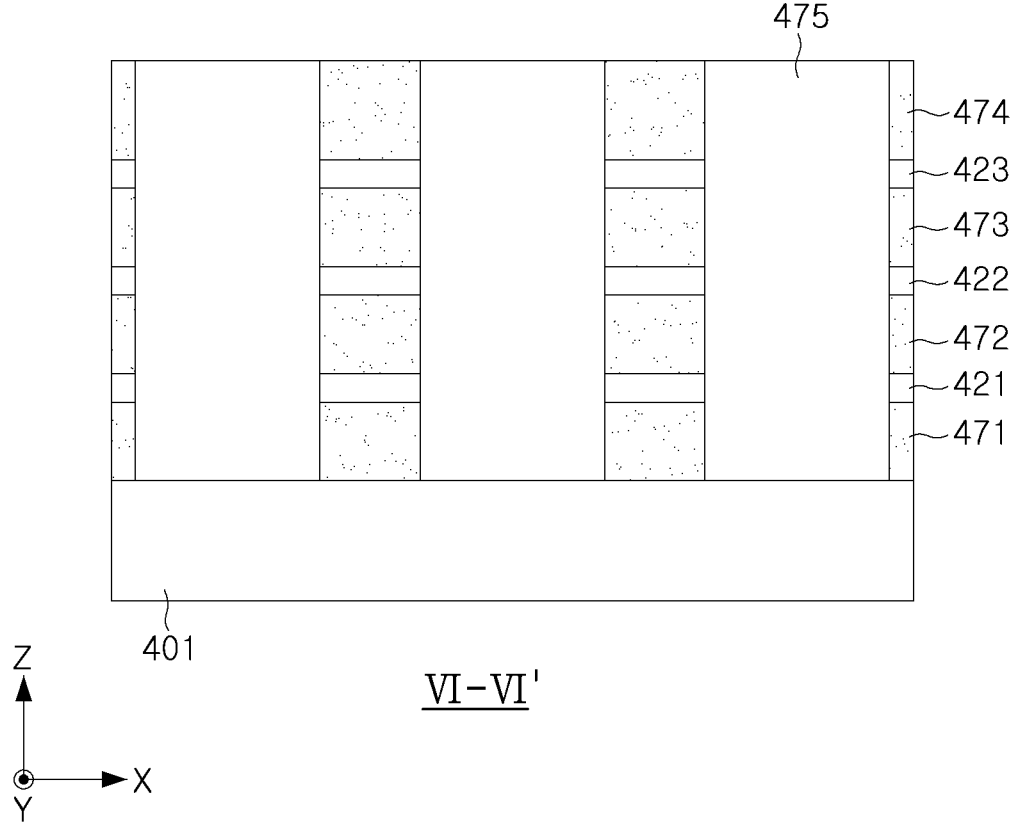

Next, referring to FIG. 14 and FIG. 15, which is a cross-sectional view in the VI-VI' direction of FIG. 14, by removing some regions of the plurality of channel layers 421-423 and the plurality of horizontal sacrificial layers 471-474 and filling in a predetermined insulating material, a plurality of vertical sacrificial layers 475 may be formed. In the example embodiment illustrated in FIG. 15, the plurality of vertical sacrificial layers 475 are illustrated as being formed to be in contact with the upper surface of the substrate 401, but may also be formed to recess at least a partial region of the substrate 401.

The plurality of vertical sacrificial layers 475 may be formed of a material different from that of the plurality of channel layers 421-423 and the plurality of horizontal sacrificial layers 471-474. For example, the plurality of channel layers 421-423 are formed of silicon, the plurality of horizontal sacrificial layers 471-474 may be formed of silicon germanium, and the plurality of vertical sacrificial layers 475 are formed of silicon nitride.

Figure 16:
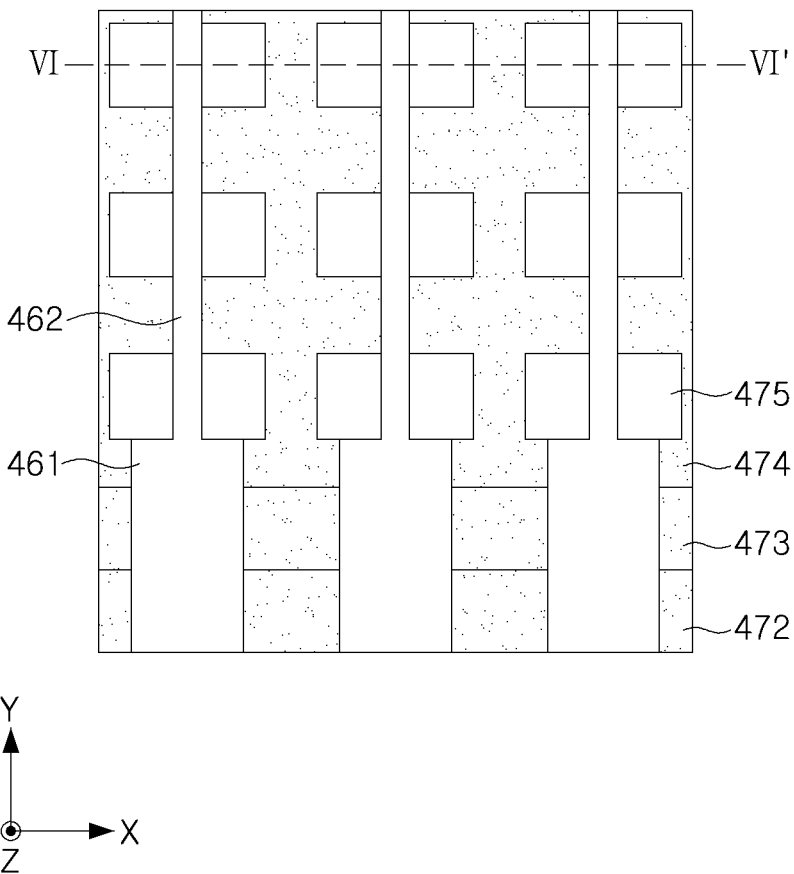
Figure 17:
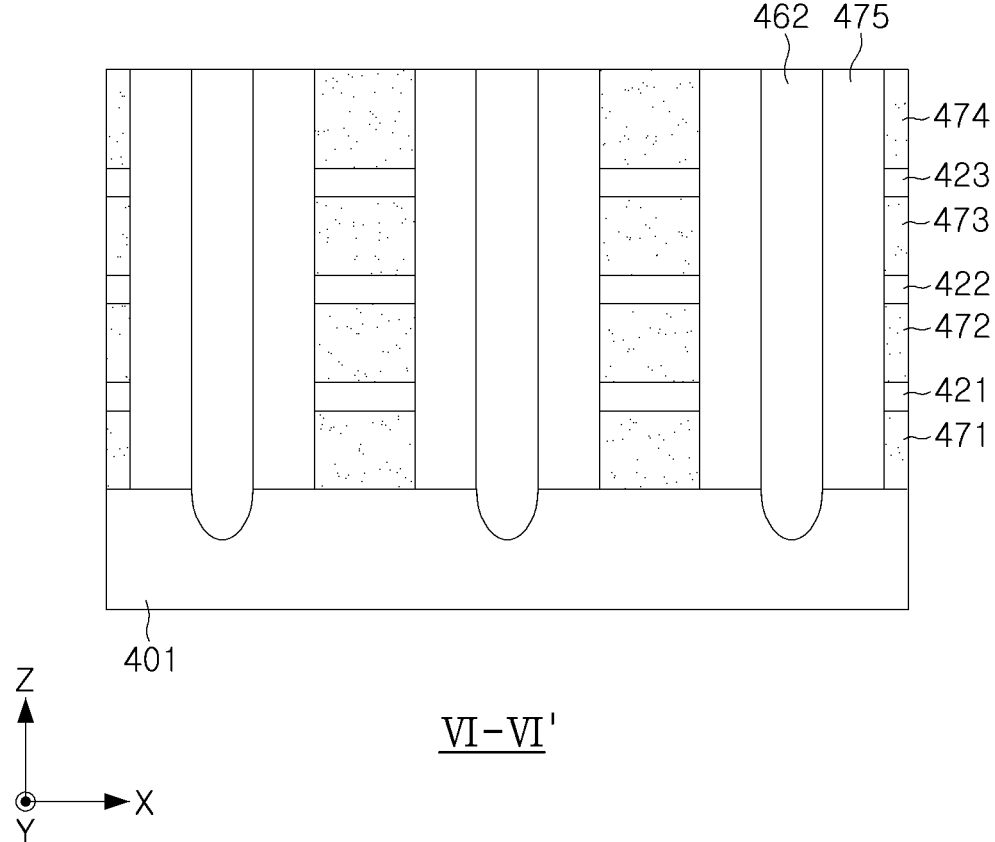

Referring to FIGS. 16 and 17, a first vertical insulating layer 461 and a second vertical insulating layer 462 may be formed. The first vertical insulating layer 461 and the second vertical insulating layer 462 may extend in the second direction and may have different widths in the first direction (X-axis direction). For example, the first vertical insulating layer 461 may have a greater width than the second vertical insulating layer 462 in the first direction.

The first vertical insulating layer 461 may be formed in a pad region in which some of the plurality of channel layers 421 and the plurality of horizontal sacrificial layers 471-474 extend to have different lengths in the second direction. The second vertical insulating layer 462 may be formed in a region where the plurality of channel layers 421, the plurality of horizontal sacrificial layers 471-474, and the plurality of vertical sacrificial layers 475 are provided. For example, in the second direction, the first vertical insulating layer 461 may have a shorter length than the second vertical insulating layer 462.

Referring to FIG. 17, the second vertical insulating layer 462 may be formed to a depth that penetrates a partial region of the substrate 401. In this case, a partial region of the second vertical insulating layer 462 penetrating the substrate 401 may function as a device isolation layer.

Figure 18:
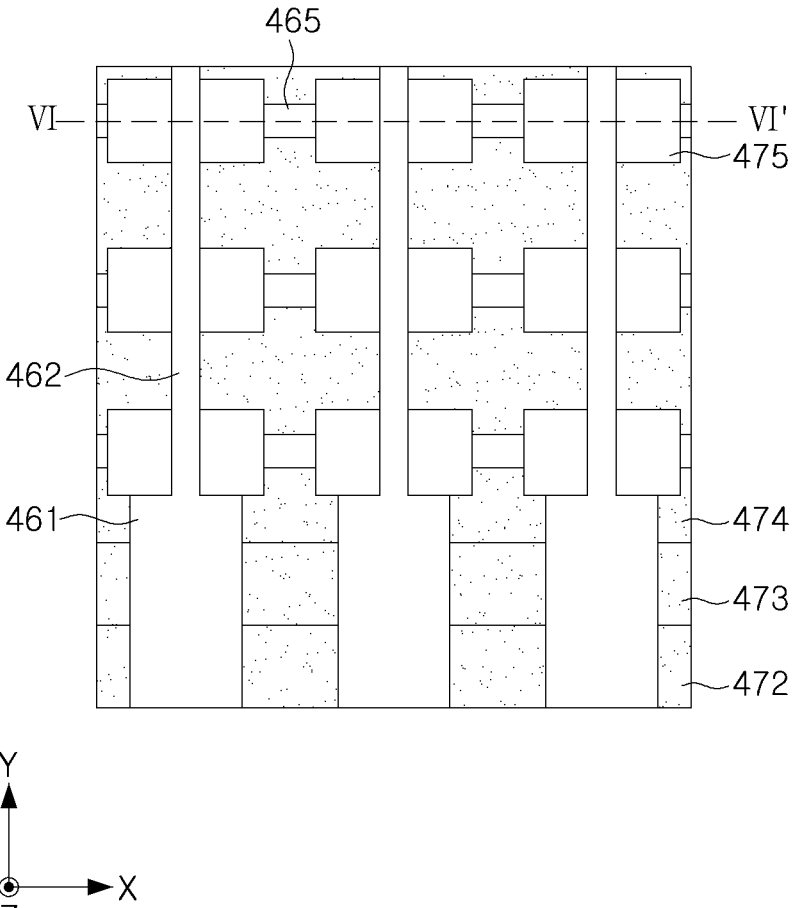
Figure 19:
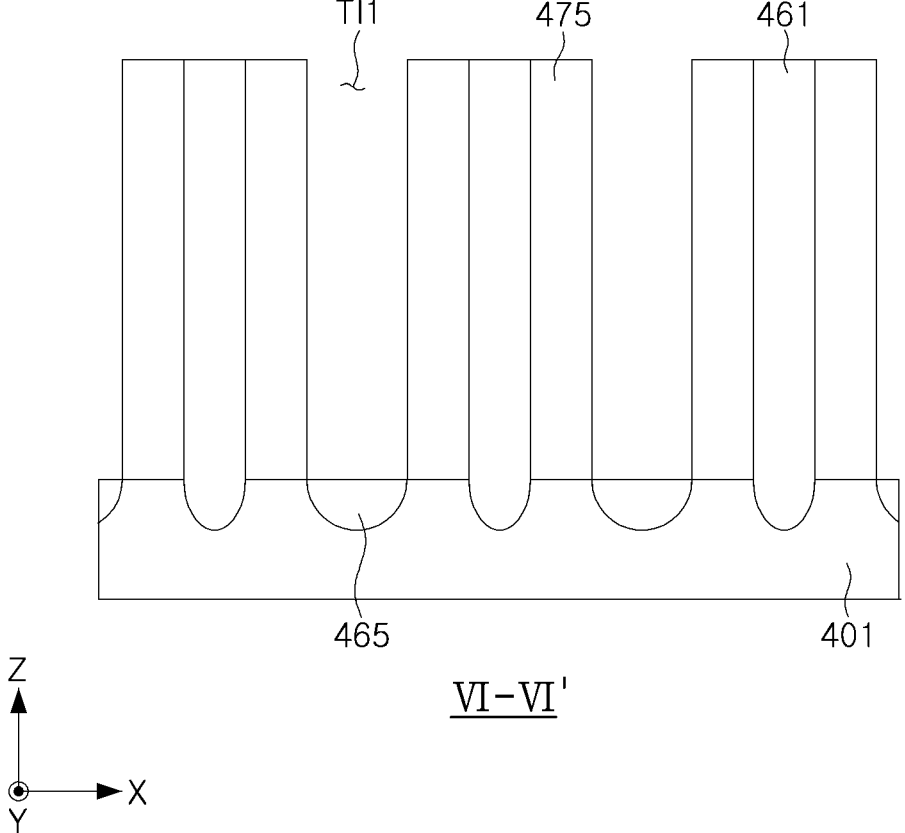

Next, referring to FIGS. 18 and 19, a plurality of first trenches TI1 and a plurality of substrate insulating layers 465 may be formed between the vertical sacrificial layers 475 adjacent to each other in the first direction. The plurality of first trenches TI1 may be formed between the vertical sacrificial layers 475 in the first direction, and may be formed by an etching process that removes the plurality of channel layers 421-423 and the plurality of horizontal sacrificial layers 471-474.

For example, the plurality of channel layers 421-423 and the plurality of horizontal sacrificial layers 471-474 between the vertical sacrificial layers 475 adjacent to each other in the first direction may be removed, and an etching process for removing even a partial region of the substrate 401 may be performed. Thereafter, insulating material such as silicon oxide may be filled in a partial region of the substrate 401 removed in the etching process to form substrate insulating layers 465. For example, the substrate insulating layers 465 may function as a device isolation layer similarly to a partial region of the second vertical insulating layer 462 provided inside the substrate 401.

Figure 20:
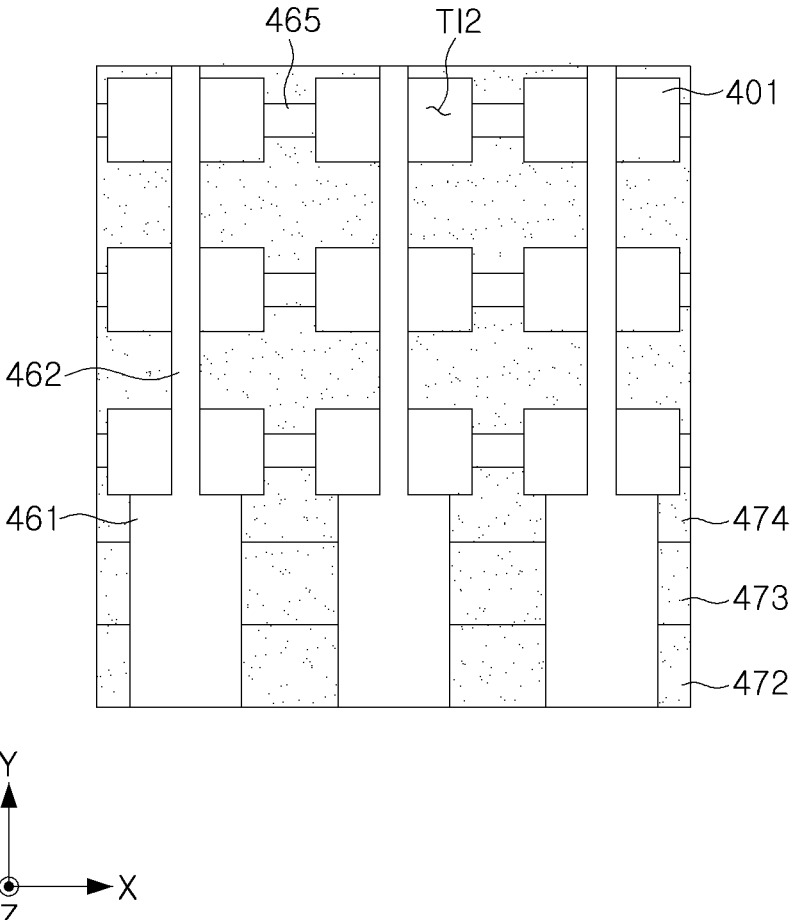

Referring to FIG. 20, an etching process of removing the plurality of vertical sacrificial layers 475 to form a plurality of second trenches TI2 may be performed. Accordingly, the upper surface of the substrate 401 may be exposed in the region where the plurality of vertical sacrificial layers 475 are provided.

In detail, a bottom surface of each of the plurality of second trenches TI2 may correspond to an upper surface of the substrate 401. On the other hand, the plurality of channel layers 421-423, the plurality of horizontal sacrificial layers 471-474, and the second vertical insulating layer 462 are exposed on side surfaces of each of the plurality of second trenches TI2.

Figure 21:
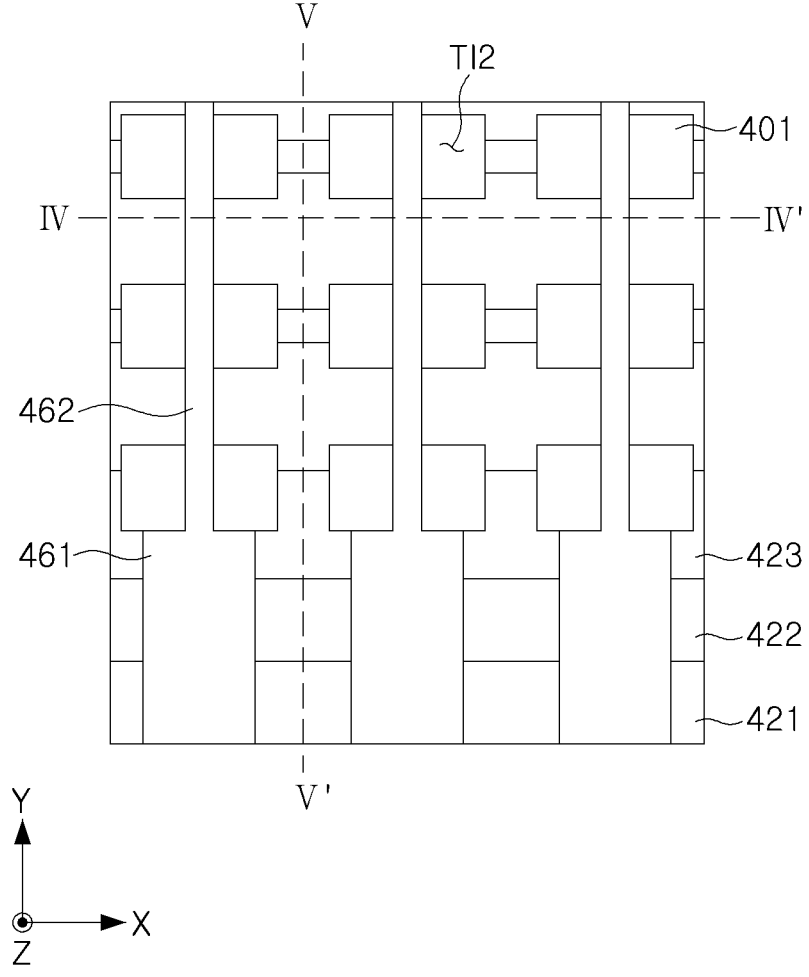
Figure 22:
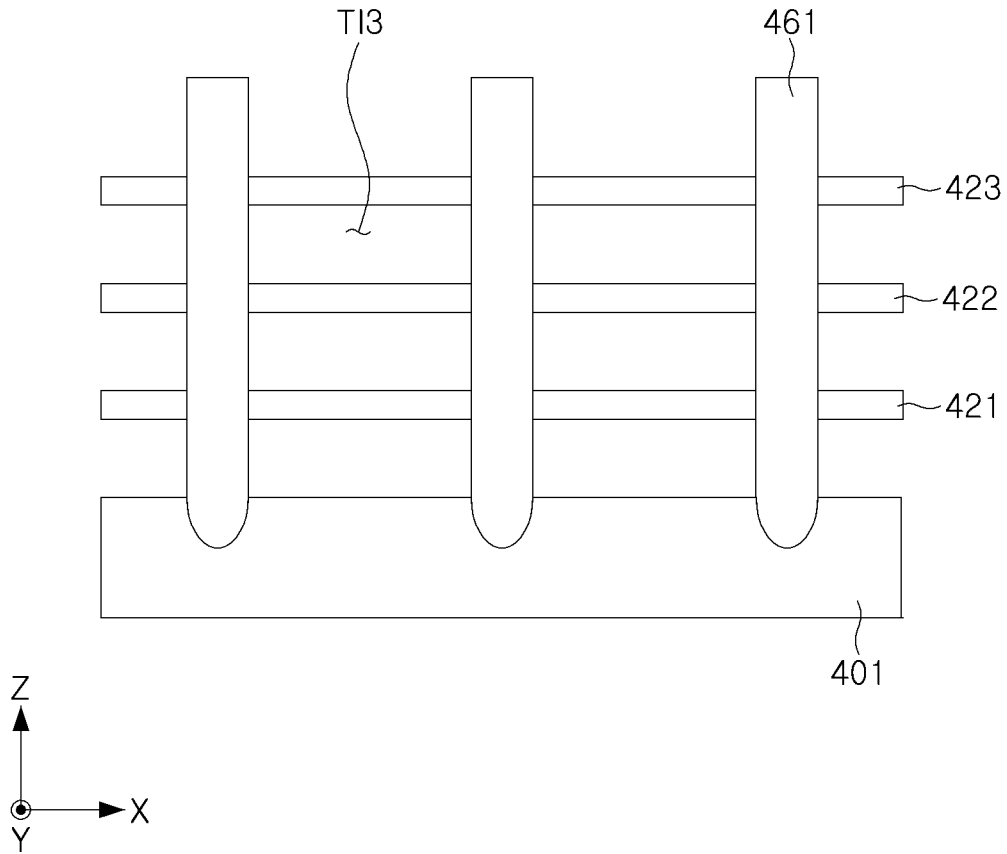
Figure 23:
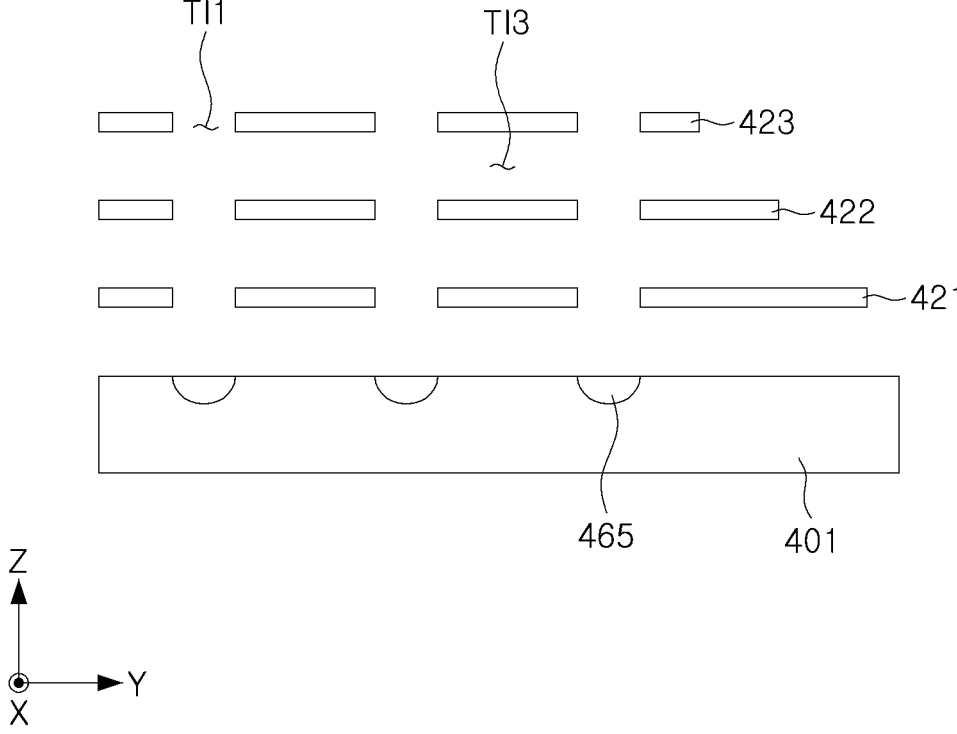

Next, referring to FIGS. 21 to 23, an etching process may be performed through the plurality of second trenches TI2. The plurality of horizontal sacrificial layers 471-474 exposed from side surfaces of the plurality of second trenches TI2 may be selectively removed by the etching process.

As illustrated in FIGS. 22 and 23, as the plurality of horizontal sacrificial layers 471-474 are removed, the plurality of third trenches TI3 may be formed between the plurality of channel layers 421-423 adjacent in the third direction. Each of the plurality of channel layers 421-423 separated from each other in the third direction is collapsed by the first vertical insulating layer 461 and the second vertical insulating layer 462 contacting each other in the first direction and the second direction, and may be supported. On the other hand, the plurality of channel layers 421-423 contacting the first vertical insulating layer 461 in the first direction may have different lengths in the second direction.

Figure 24:
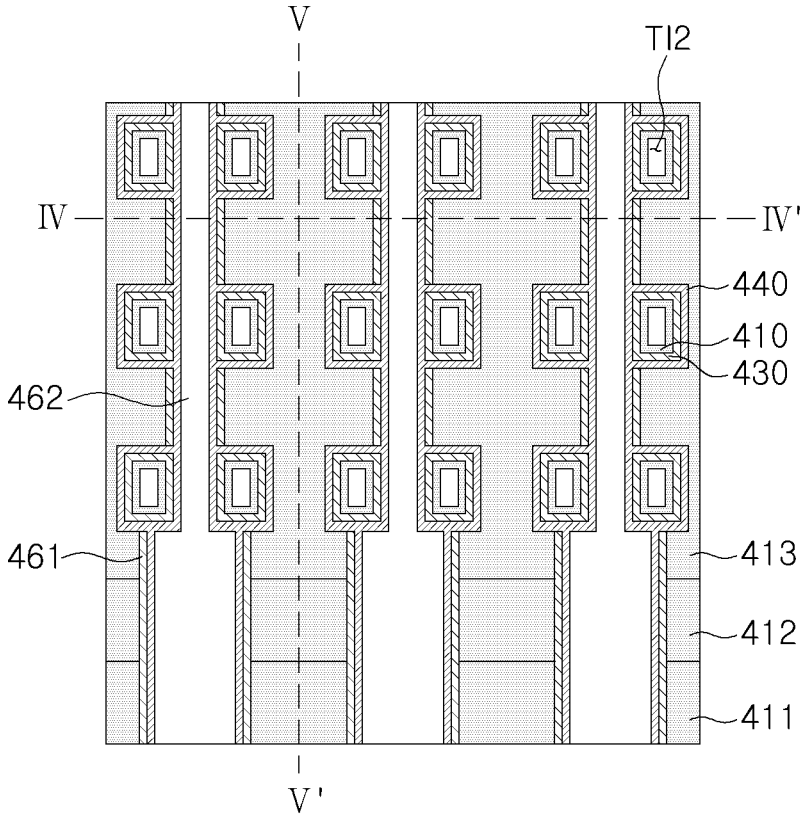
Figure 25:
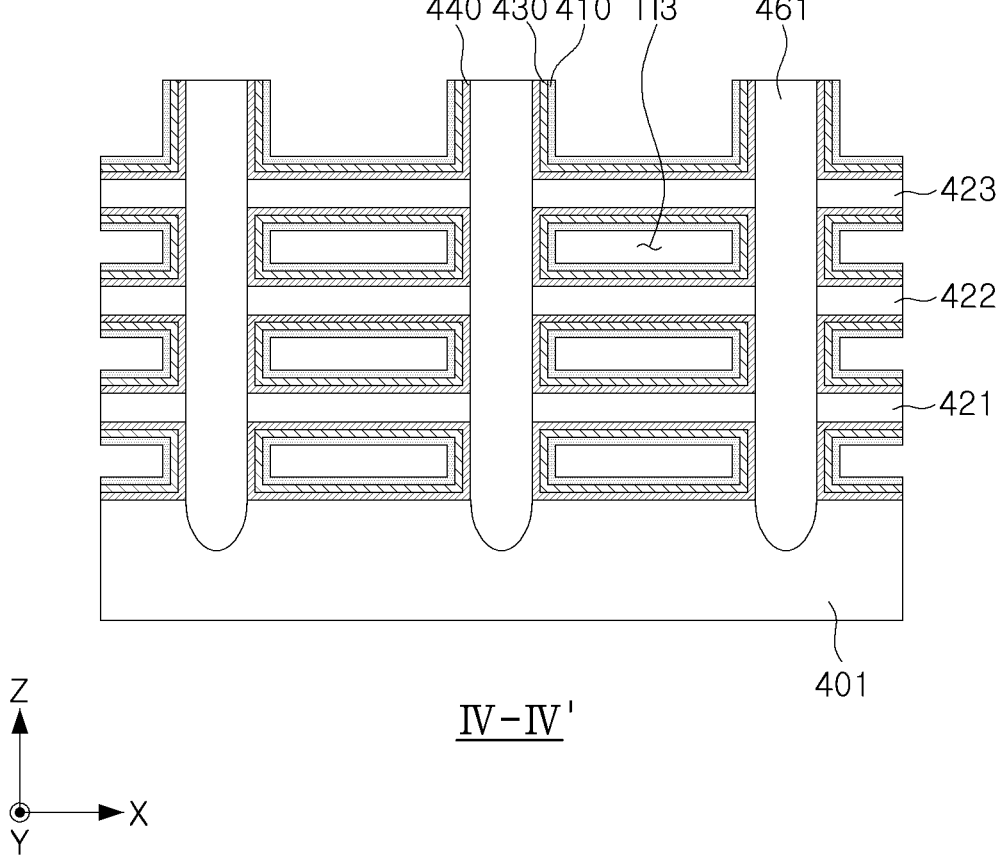
Figure 26:
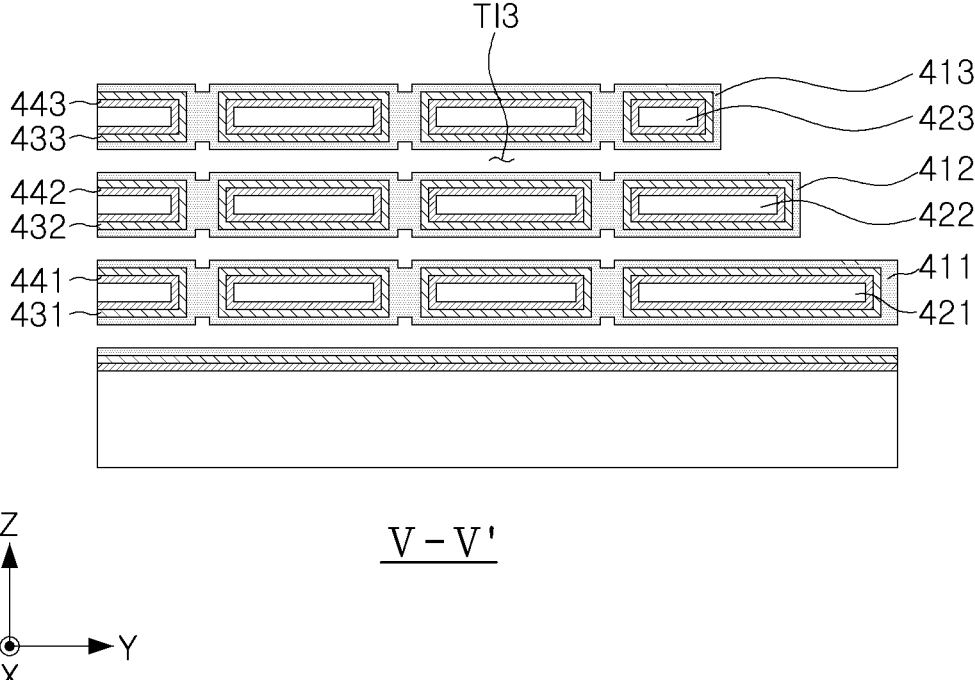

Referring to FIGS. 24 to 26, in the plurality of first trenches TI1, the plurality of second trenches TI2, and the plurality of third trenches TI3. A gate insulating layer 440, a ferroelectric layer 430, and a gate electrode layer 410 may be sequentially formed. Therefore, as illustrated in FIGS. 25 and 26, each of the plurality of channel layers 421-423 may be surrounded by the gate insulating layer 440, the ferroelectric layer 430, and the gate electrode layer 410 stacked in order, in the second direction and the third direction. Each of the plurality of channel layers 421-423 may contact the second vertical insulating layer 462 in the first direction.

However, as illustrated in FIGS. 25 and 26, the plurality of third trenches TI3 may not be completely filled. In FIGS. 25 and 26, each of the plurality of third trenches TI3 between the plurality of channel layers 421-423 adjacent to each other in the third direction may be defined as a space inside the gate electrode layer 410. On the other hand, the gate insulating layer 440, the ferroelectric layer 430, and the gate electrode layer 410 may be sequentially stacked on the upper surface of the substrate 401.

Figure 27:
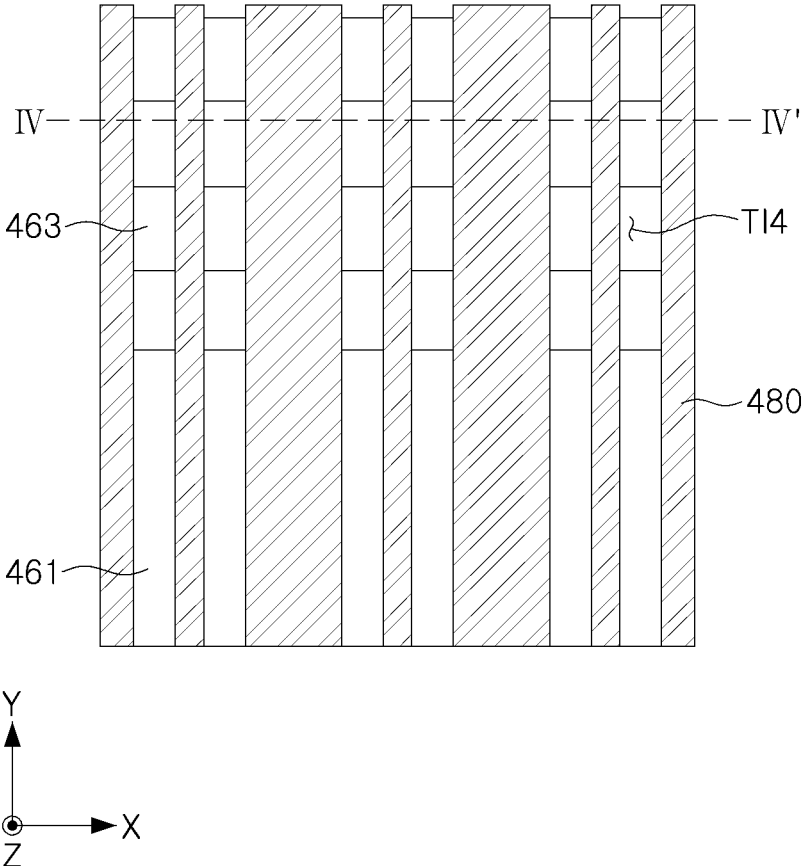
Figure 28:
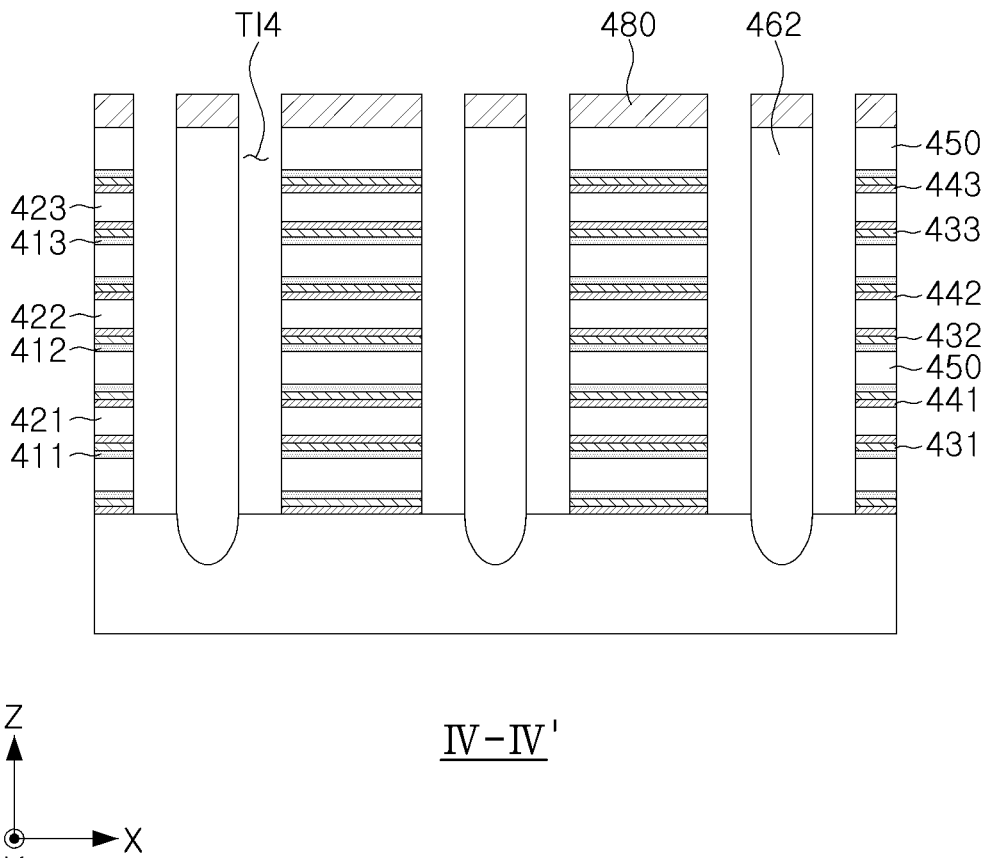
Figure 29:
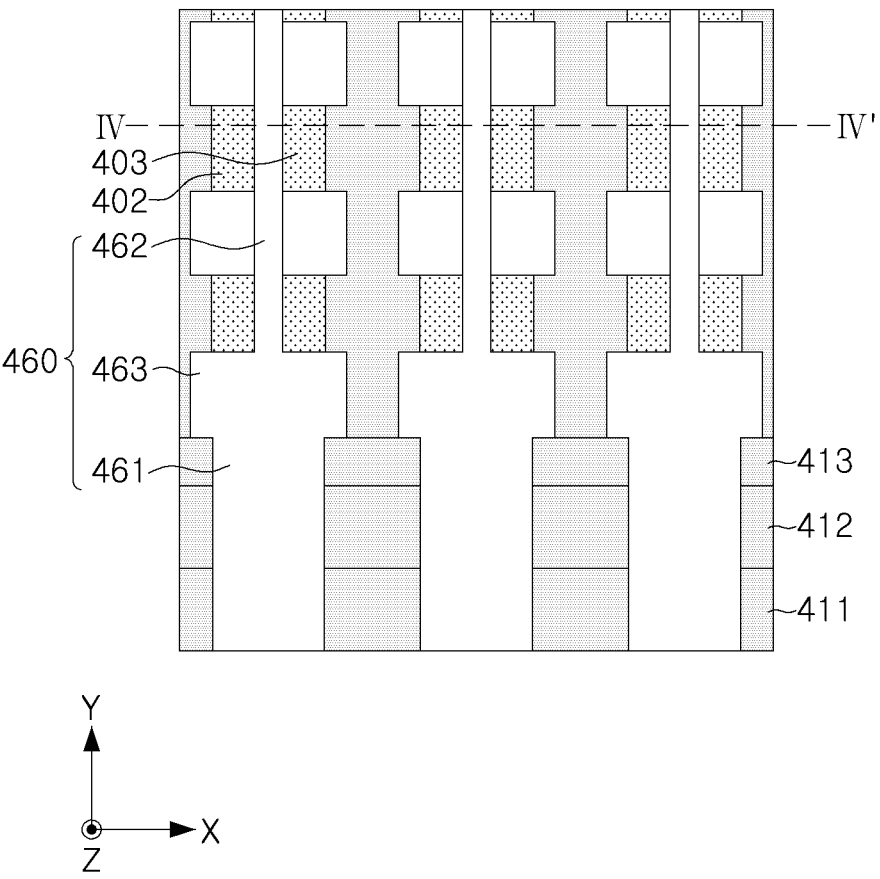
Figure 30:
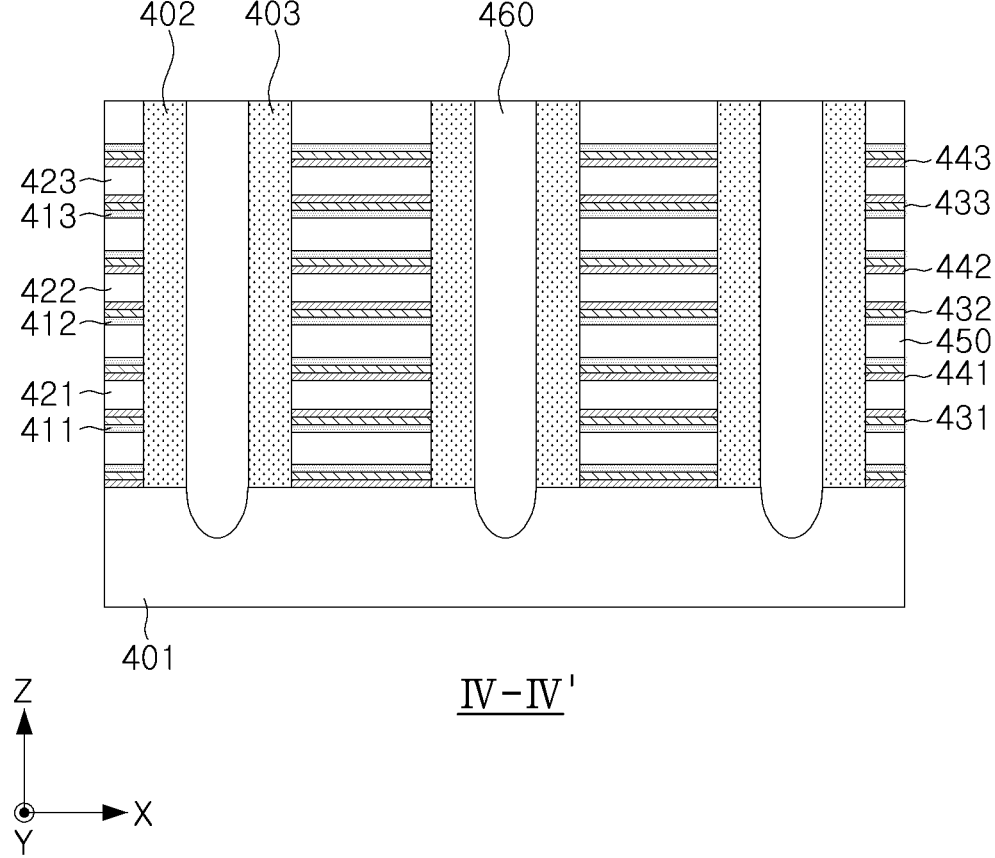

Next, referring to FIGS. 27 and 28, a mask layer 480 having patterns extending in the second direction may be formed. For example, before forming the mask layer 480, as illustrated in FIG. 24, the gate insulating layer 440, the ferroelectric layer 430, and the gate electrode layer 410 stacked on the inner sidewalls of the plurality of second trenches TI2 may be removed, and the plurality of second trenches TI2 may be filled with the same insulating material as the first vertical insulating layer 461 and the second vertical insulating layer 462. Accordingly, as illustrated in FIG. 27, a third vertical insulating layer 463 may be formed.

The region removed using the mask layer 480 may be a region in which active regions are provided. 27 and 28, by performing an etching process on regions adjacent to both sides of the second vertical insulating layer 462 in the first direction, a plurality of fourth trenches TI4 may be formed. An upper surface of the substrate 401 may be exposed from a bottom surface of the plurality of fourth trenches TI4.

29 and 30, by performing a selective epitaxial growth process based on the upper surface of the substrate 401 exposed in the plurality of fourth trenches TI4, the first active region 402 and the second active region TI4 are A region 403 may be formed. Each of the first active region 402 and the second active region 403 may be formed to include impurities by in-situ doping. Each of the first active region 402 and the second active region 403 may contact the second vertical insulating layer 462 on one side in the first direction, and may contact the first to third channel layers 421-423 on the other side.

As described with reference to FIGS. 27 to 30, by performing the process of forming the first active region 402 and the second active region 403, each of the first to third channel layers 421-423 may be in contact with the first active region 402 and the second active region 403 on both sides in one direction. In addition, the first to third channel layers 421-423 may be surrounded by first to third gate insulating layers 441-443, first to third ferroelectric layers 431-433, and first to third gate electrode layers 411-413 in the second and third directions.

Figure 31:
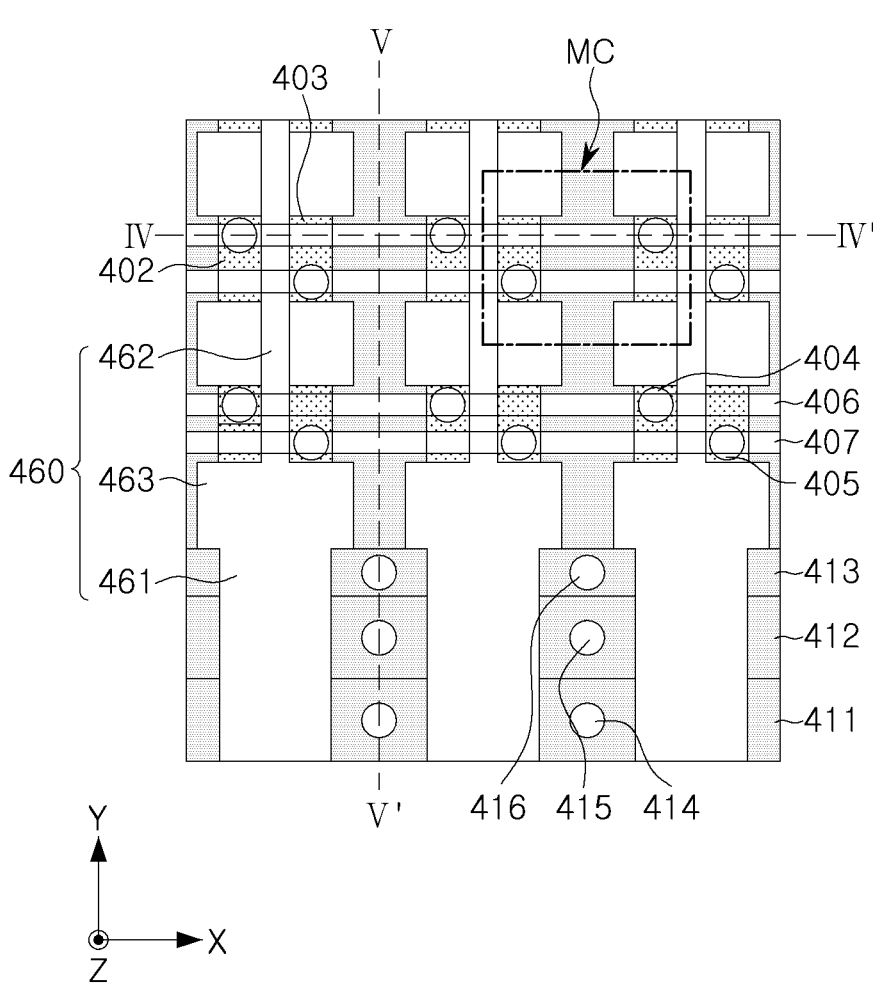
Figure 32:
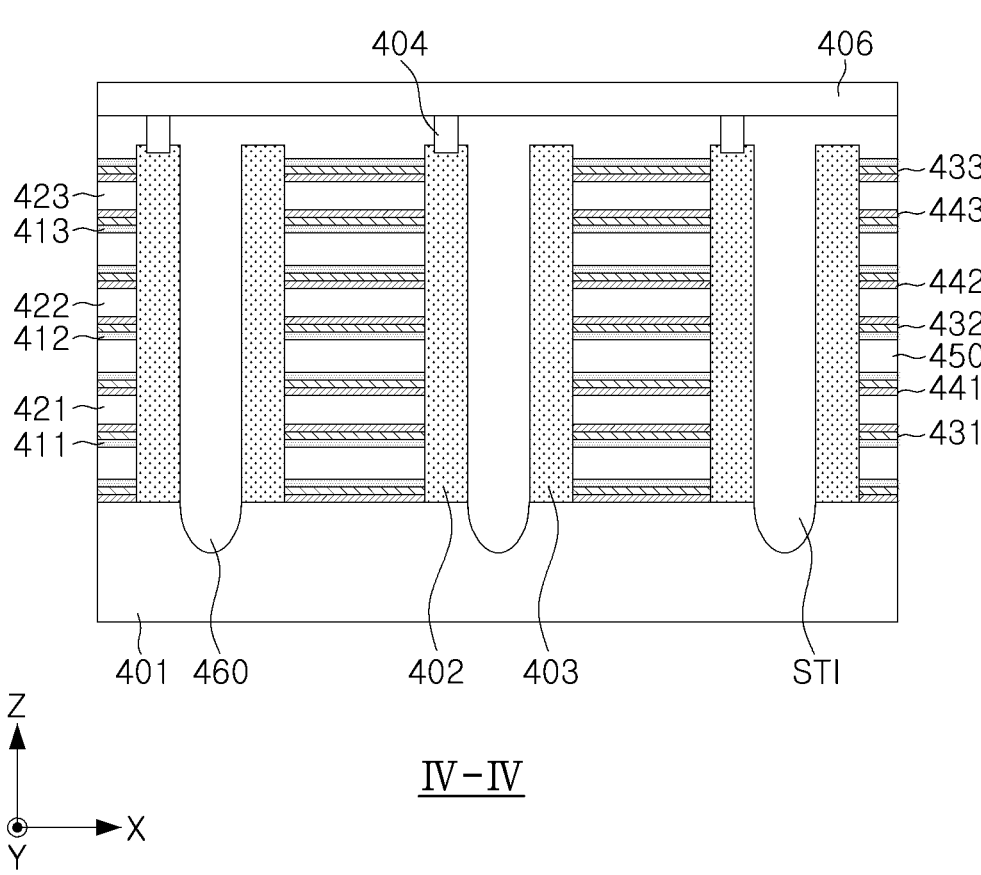
Figure 33:
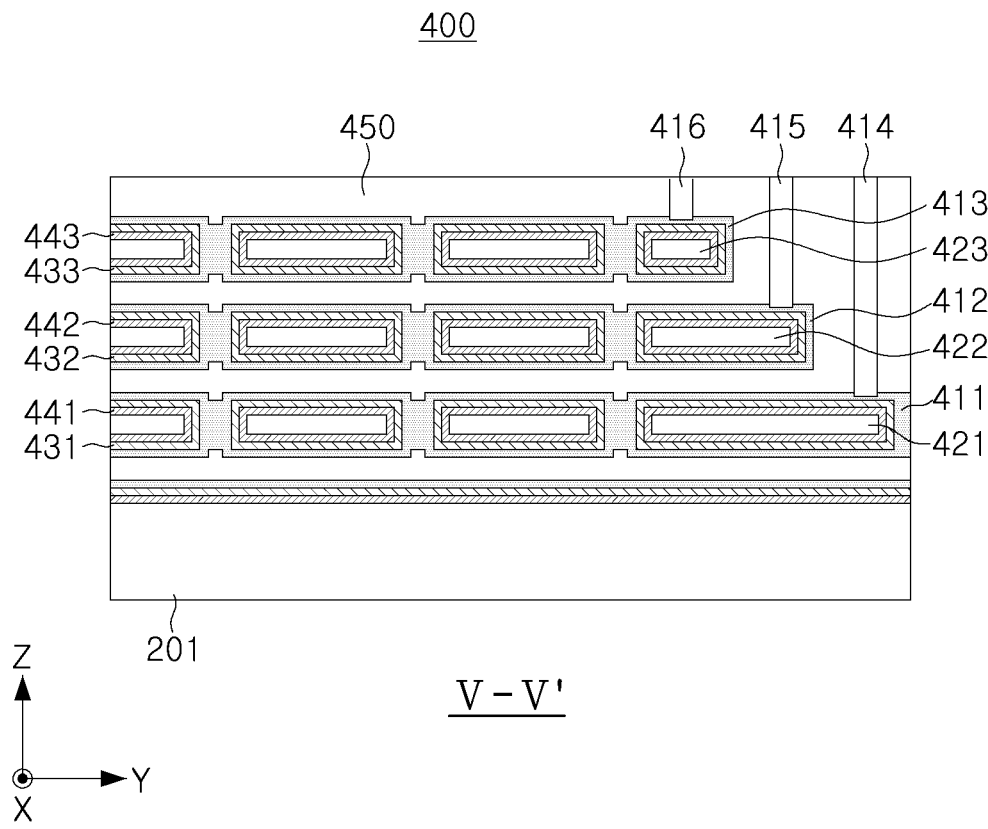

Next, referring to FIGS. 31 to 33, a plurality of contacts, a plurality of source lines 406, and a plurality of bit lines 407 may be formed. First, first to third gate contacts 414-416 connected to the first to third gate electrode layers 411-413 may be formed. The first to third gate contacts 414-416 and the first to third gate electrode layers 411-413 may correspond to each other in a one-to-one manner. The first to third gate electrode layers 411-413 may be formed to have different lengths in the second direction, and the first to third gate contacts 414-416 may be formed in a region adjacent to the first vertical insulating layer 461.

The first active region 402 is connected to one of the plurality of source lines 406 through a source line contact 404, and the second active region 403 may be connected to one of the plurality of bit lines 407 through the bit line contact 405. The plurality of source lines 406 and the plurality of bit lines 407 may extend in the first direction.

Referring to FIGS. 31 to 33, each of the memory cells MC may be defined by the first active region 402 and the second active region 403 adjacent to each other with the first and third channel layers 421-423 interposed therebetween in the first direction. In addition, each of the memory cells MC may include first to third memory elements ME1-ME3, and the first to third memory elements ME1-ME3 may share the first active region 402 and the second active region 403.

However, the first gate electrode layer 411 of the first memory element ME1, the second gate electrode layer 412 of the second memory element ME2, and the third gate electrode layer 413 of the third memory element ME3 Since they are separated from each other, and the first to third memory elements ME1 to ME3 may be individually programmed. In detail, the first to third memory elements ME1 to ME3 may have different threshold voltages depending on whether or not the program is programmed and programmed data.

As described above, the first to third memory elements ME1-ME3 included in each of the memory cells MC may store weights corresponding to connection paths of hidden nodes included in the neural network. For example, when one weight is converted into 3-bit data and stored in the semiconductor device 400, one weight may be stored in each of the memory cells MC. When one weight is converted into 12-bit data and stored in the semiconductor device 400, one weight may be stored in four memory cells MC sharing one bit line among the plurality of bit lines 407 and one source line among the plurality of source lines 406. In this case, in an inference operation using a neural network, an input voltage corresponding to an input value may be input to the one bit line, and currents output from each of the four memory cells MC may be combined in the one source line and transferred to the ADC. When the received current is greater than the reference current, the ADC may be transferred to other memory cells (MC) or other tiles corresponding to the next hidden node of the neural network.

On the other hand, the manufacturing method described with reference to FIGS. 10 to 33 may be a manufacturing method for a cell region in which the memory cells MC are provided in the semiconductor device 400. In addition to the cell region, the semiconductor device 400 may further include a peripheral circuit region in which a row driver, a column driver, an ADC circuit, and the like for controlling the memory cells MC are provided. The peripheral circuit region may be stacked with the cell region in the third direction, or may be provided outside the cell region in the first direction and the second direction, depending on the example embodiment. Hereinafter, it will be described with reference to FIGS. 34A to 34C.

Figure 34A:
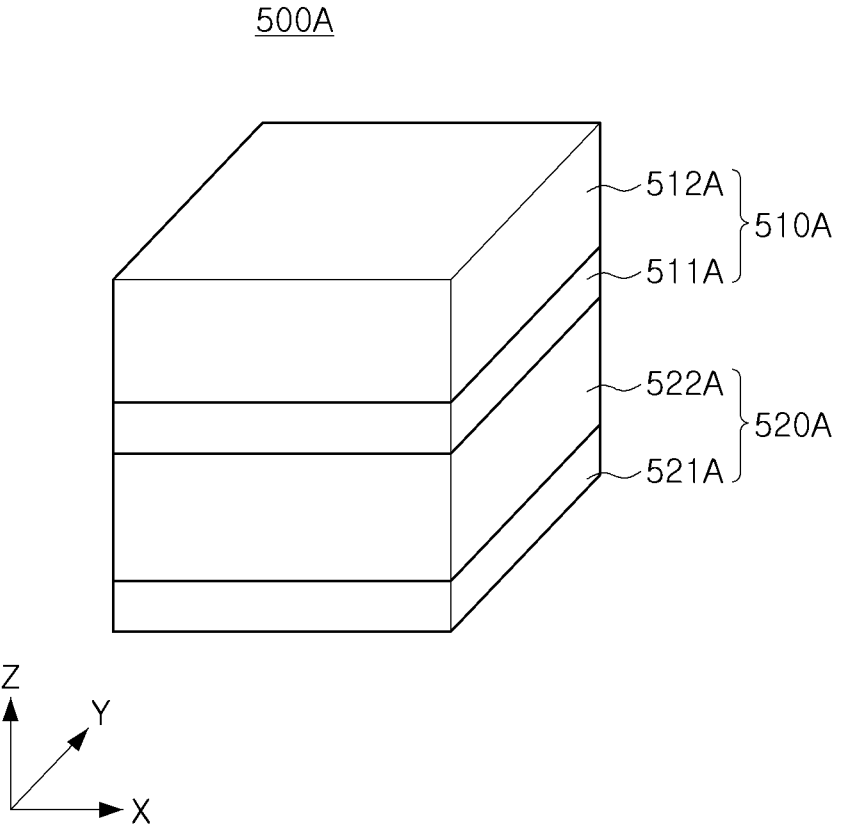
FIGS. 34A to 34C are diagrams illustrating a semiconductor device according to an example embodiment.
Figure 34B:
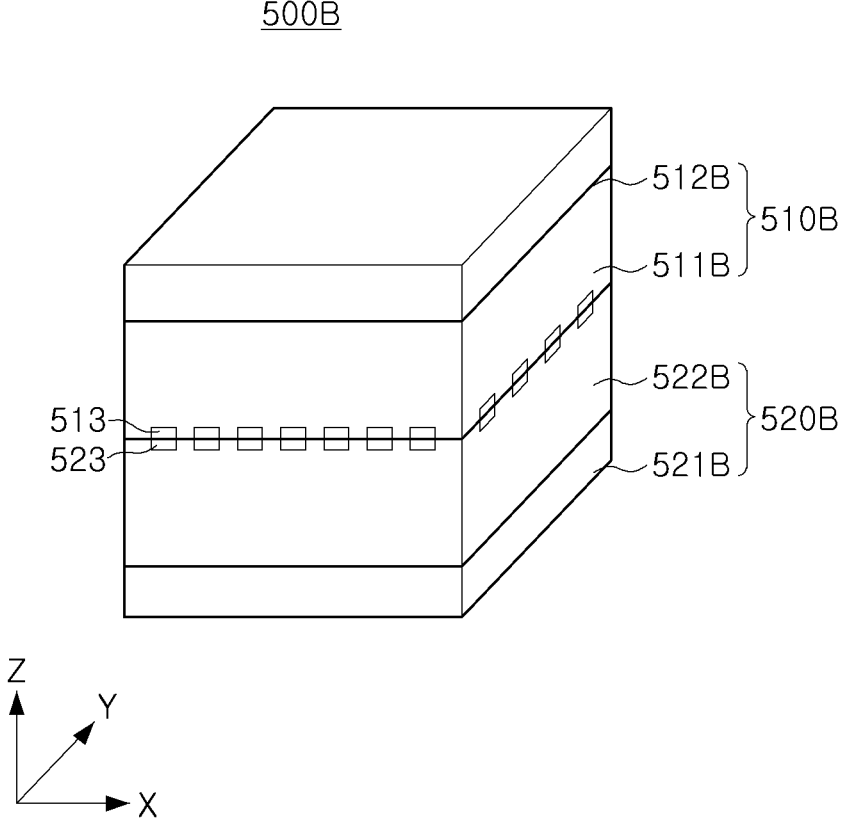
Figure 34C:
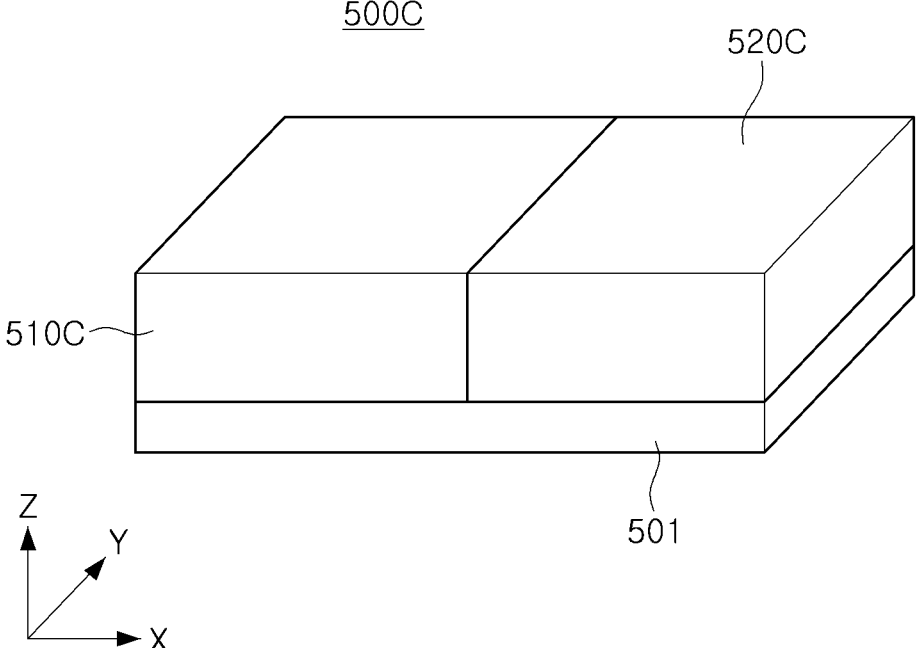

FIGS. 34A to 34C are diagrams illustrating a semiconductor device according to an example embodiment.

Referring first to FIG. 34A, a semiconductor device 500A may include a cell region 510A and a peripheral circuit region 520A. The cell area 510A may include a first substrate 511A parallel to a plane defined by a first direction (X-axis direction) and a second direction (Y-axis direction), a cell array region 512A provided on the first substrate 511A, and the like. For example, memory cells formed by the method described above with reference to FIGS. 10 to 33 may be provided in the cell array region 512A.

On the other hand, the peripheral circuit region 520A may include a second substrate 521A and a device region 522A provided on the second substrate 521A. In the device region 522A, a plurality of elements formed on the second substrate 521A, a plurality of wiring patterns connecting the plurality of elements, a lower interlayer insulating layer covering a plurality of elements and a plurality of wiring patterns, and the like may be included. The upper surface of the lower interlayer insulating layer may contact the lower surface of the first substrate 511A.

The cell region 510A and the peripheral circuit region 520A may be stacked on each other in the third direction (Z-axis direction). For example, in the cell region 510A, a plurality of bit lines, a plurality of source lines, and a plurality of gate contacts connected to the memory cells may be connected to at least some of the wiring patterns of the device region 522A through via structures penetrating the first substrate 511A. For example, the device region 522A may provide a row driver, a column driver, an ADC circuit and the like, the row driver may be connected to a plurality of gate contacts, the column driver is connected to a plurality of bit lines, and the ADC circuit may be connected to a plurality of source lines.

Referring to FIG. 34B, the semiconductor device 500B includes a cell region 510B and a peripheral circuit region 520B, and the cell region 510B and the peripheral circuit region 520B may be stacked on each other in the third direction (Z-axis direction). The cell region 510B may include a first substrate 511B, a cell array region 512B in which memory cells are provided, and the like, and the peripheral circuit region 520B may include a second substrate 521B, and a device region 522B providing row drivers, column drivers, an ADC circuit and the like.

In an example embodiment illustrated in FIG. 34B, upper pads 513 connected to a plurality of bit lines, a plurality of source lines, and a plurality of gate contacts in the cell array region 512B, the device region 522B may be directly connected to the lower pads 523 connected to the wiring patterns. For example, the upper pads 513 and the lower pads 523 may be bonded to each other by a Cu—Cu bonding method, and may be bonded to each other at a chip level or a wafer level.

In an example embodiment illustrated in FIG. 34C, both the cell region 510C and the peripheral circuit region 520C may be formed on one substrate 501 in the semiconductor device 500C. Although FIG. 34C illustrates that the peripheral circuit region 520C is provided on one side of the cell region 510C in the first direction (X-axis direction), according to an example embodiment, the cell region 510C and the peripheral circuit region 520C The arrangement may be variously modified. For example, if it is assumed that the plurality of source lines and the plurality of bit lines extend in a first direction and the gate electrode layers extend in a second direction (Y-axis direction), among the circuits included in the peripheral circuit region 520C, a column driver and an ADC circuit may be provided in a region adjacent to the cell region 510C in the first direction. On the other hand, the row driver connected to the gate electrode layers may be provided in a region adjacent to the cell region 510C in the second direction.

As set forth above, according to an example embodiment, each of the plurality of memory cells included in the semiconductor device may include a plurality of channel layers separated from each other in a direction perpendicular to the upper surface of the substrate, and a pair of active regions connected to the plurality of channel layers, and each of the plurality of channel layers may be surrounded by a ferroelectric layer and a gate electrode layer. Gate electrode layers surrounding the plurality of channel layers may be separated from each other, and thus, one memory cell may provide a plurality of memory elements. The plurality of respective memory elements included in one memory cell may be programmed to have different threshold voltages, and the currents of the plurality of memory elements may be summed to generate an output current of the memory cell, thereby providing a semiconductor device suitable for computation based on a neural network.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
a cell region comprising a plurality of memory cells arranged in a first direction and a second direction, the plurality of memory cells arranged parallel to an upper surface of a substrate; and
a peripheral circuit region configured to control the plurality of memory cells,
wherein each of the plurality of memory cells comprises:
a first active region and a second active region provided adjacent to each other in the first direction, the first active region and the second active region extending in a third direction, perpendicular to the upper surface of the substrate,
a first channel layer and a second channel layer separated from each other in the third direction and connected to the first active region and the second active region, the first channel layer and the second channel layer extending in the first direction,
a first ferroelectric layer and a first gate electrode layer sequentially provided on the first channel layer, and
a second ferroelectric layer and a second gate electrode layer sequentially provided on the second channel layer, and
wherein the first gate electrode layer and the second gate electrode layer are separated from each other in the third direction, and electrically isolated from each other in the third direction, by an interlayer insulating layer disposed between the first gate electrode layer and the second gate electrode layer, and
wherein each of the first channel layer, the second channel layer, the first ferroelectric layer, the first gate electrode layer, the second ferroelectric layer and the second gate electrode contacts the first active region and the second active region.

2. The semiconductor device of claim 1, wherein the peripheral circuit region comprises:

an analog to digital converter (ADC) circuit connected to the plurality of memory cells through a plurality of source lines and a plurality of bit lines extending in the first direction, and
a row driver connected to the plurality of memory cells through the first gate electrode layer and the second gate electrode layer.

3. The semiconductor device of claim 2, wherein each of the plurality of memory cells further comprises:
a source line contact connecting one of the plurality of source lines to the first active region, and
a bit line contact connecting one of the plurality of bit lines to the second active region,
wherein, in each of the plurality of memory cells, the source line contact and the bit line contact are provided in different positions in the second direction.

4. The semiconductor device of claim 1, wherein some of the plurality of memory cells, provided in a same position in the first direction, share the first gate electrode layer and the second gate electrode layer.

5. The semiconductor device of claim 4, wherein in the third direction, the first gate electrode layer is provided closer to the upper surface of the substrate than the second gate electrode layer, and
wherein in the second direction, a first length of the first gate electrode layer is longer than a second length of the second gate electrode layer.

6. The semiconductor device of claim 1, wherein a pair of memory cells adjacent in the first direction among the plurality of memory cells share one first active region.

7. The semiconductor device of claim 1, wherein each of the plurality of memory cells further comprises:
a first gate insulating layer provided between the first channel layer and the first ferroelectric layer, and
a second gate insulating layer provided between the second channel layer and the second ferroelectric layer.

8. The semiconductor device of claim 1, wherein the cell region further comprises an active isolation layer provided between a pair of memory cells adjacent in the second direction among the plurality of memory cells,
wherein a length of the active isolation layer is longer than a length of the first active region and a length of the second active region in the first direction.

9. The semiconductor device of claim 1, wherein each of the plurality of memory cells further comprises:
a third channel layer provided on the second channel layer in the third direction, and
a third ferroelectric layer and a third gate electrode layer sequentially provided on the third channel layer.

10. The semiconductor device of claim 1, wherein each of the plurality of memory cells comprises:
a first memory element formed by the first gate electrode layer, the first ferroelectric layer, the first channel layer, the first active region and the second active region, and
a second memory element formed by the second gate electrode layer, the second ferroelectric layer, the second channel layer, the first active region, and the second active region.

11. The semiconductor device of claim 10, wherein the first memory element and the second memory element are respectively individually programmed.

12. A semiconductor device comprising:
a cell region comprising a plurality of memory cells configured to store weight data corresponding to a weight of a neural network, each of the plurality of memory cells comprising:

a first active region and a second active region provided adjacent to each other in a first direction, parallel to an upper surface of a substrate, a plurality of gate electrode layers extending in a second direction between the first active region and the second active region and separated from each other in a third direction, perpendicular to the upper surface of the substrate, and a plurality of channel layers surrounded by the plurality of gate electrode layers and connected to the first active region and the second active region in the first direction;

an analog to digital converter (ADC) circuit connected to the first active region of each of the plurality of memory cells through a plurality of source lines and connected to the second active region of each of the plurality of memory cells through a plurality of bit lines; and a row driver connected to the plurality of gate electrode layers, wherein the plurality of gate electrode layers are electrically isolated from each other in the third direction, by an interlayer insulating layer disposed between the plurality of gate electrode layers, and wherein the plurality of channel layers and the plurality of gate electrode layers contact the first active region and the second active region.

13. The semiconductor device of claim 12, wherein the neural network comprises a first hidden layer and a second hidden layer respectively having a plurality of hidden nodes, wherein a first weight corresponding to a connection between a first hidden node included in the first hidden layer to a second hidden node included in the second hidden layer is converted into first weight data of 2 bits or more, to be stored in two or more memory cells among the plurality of memory cells.

14. The semiconductor device of claim 13, wherein the two or more memory cells are commonly connected to one bit line of the plurality of bit lines and one source line of the plurality of source lines.

15. The semiconductor device of claim 13, wherein each of the two or more memory cells comprises two or more first memory elements and two or more second memory elements, wherein the two or more first memory elements included in the two or more memory cells share one of the plurality of gate electrode layers, and wherein the two or more second memory elements included in the two or more memory cells share another one of the plurality of gate electrode layers.

16. The semiconductor device of claim 13, wherein a number of memory devices included in the two or more memory cells is greater than a number of bits of the weight data.

17. The semiconductor device of claim 15, wherein each of the two or more first memory elements and the each of the two or more second memory elements included in the two or more memory cells stores the bits of the weight data one by one.

18. A semiconductor device comprising:

a cell region comprising:

a plurality of memory cells, each of the plurality of memory cells comprising: two or more memory elements configured to share active regions, each of the two or more memory elements comprising a gate electrode layer and a channel layer, the plurality of memory cells being arranged in a first direction and a second direction parallel to an upper surface of a substrate, a plurality of source lines extending in the first direction, and a plurality of bit lines extending in the first direction and alternately provided with the plurality of source lines in the second direction; and a peripheral circuit region configured to control the plurality of memory cells, wherein the peripheral circuit region configured to distribute and store bits of weight data corresponding to a weight among weights included in a neural network in two or more memory cells commonly connected to one source line among the plurality of source lines and one bit line among the plurality of bit lines, and wherein each of the two or more memory cells comprises:

a first memory element having a first end connected to the one source line and a second end connected to the one bit line, and a second memory element having a first end connected to the one source line and a second end connected to the one bit line, wherein each of the plurality of memory cells comprises two or more gate electrode layers, and wherein the two or more gate electrode layers are separated from each other in a third direction perpendicular to the upper surface of the substrate, and electrically isolated from each other in the third direction, by an interlayer insulating layer disposed between the two or more gate electrode layers, and wherein each of the gate electrode layer and the channel layer contacts the first active region and the second active region.

19. The semiconductor device of claim 18, wherein the two or more memory cells are sequentially provided in the first direction.

20. The semiconductor device of claim 18, wherein each of the plurality of memory cells further comprises two or more channel layers corresponding to the two or more memory elements, and wherein the two or more channel layers are separated from each other in the third direction.

\* \* \* \* \*